(12) United States Patent  (10) Patent No.: US 7,705,625 B2
Yoo et al.  (45) Date of Patent: Apr. 27, 2010

(54) SOURCE TRANSISTOR CONFIGURATIONS AND CONTROL METHODS

(75) Inventors: Seung-Moon Yoo, Santa Clara, CA (US); Jae Hoon Yoo, Pleasanto, CA (US); Jeongduk Sohn, San Ramon, CA (US); Sung Ju Son, Santa Clara, CA (US); Myung Chan Choi, San Jose, CA (US); Young Tae Kim, San Jose, CA (US); Oh Sang Yoon, Santa Clara, CA (US); Sang-Kyun Han, Sunnyvale, CA (US)

(73) Assignee: Zmos Technology, Inc., San Jose, CA (US)

( * ) Notice: Subject to any disclaimer, the term of this patent is extended or adjusted under 35 U.S.C. 154(b) by 0 days.

(21) Appl. No.: 11/483,263

(22) Filed: Jul. 6, 2006

(65) Prior Publication Data

US 2007/0063763 A1  Mar. 22, 2007

Related U.S. Application Data

(60) Provisional application No. 60/697,672, filed on Jul. 8, 2005.

(51) Int. Cl.
*H03K 19/094* (2006.01)
(52) U.S. Cl. .............................. 326/26; 326/83; 326/87
(58) Field of Classification Search ................... 326/26, 326/82–83, 86–87
See application file for complete search history.

(56) References Cited

U.S. PATENT DOCUMENTS

| | | | |
|---|---|---|---|
| 4,823,174 A | | 4/1989 | Itoh et al. |
| 4,888,498 A | * | 12/1989 | Kadakia ..................... 327/546 |
| 5,025,178 A | * | 6/1991 | Nunally ....................... 326/14 |
| 5,790,466 A | | 8/1998 | Hotta |
| 6,285,213 B1 | * | 9/2001 | Makino ....................... 326/81 |

(Continued)

FOREIGN PATENT DOCUMENTS

WO   2005/031973 A   4/2005

OTHER PUBLICATIONS

Johnson, Mark C. et al. "Leakage Control With Efficient Use of Transistor Stacks in Single Threshold CMOS" IEEE Transactions on Very Large Scale Intergrated (VLSI) Systems, vol. 10, No. 1, Feb. 1002.

(Continued)

*Primary Examiner*—Rexford N Barnie
*Assistant Examiner*—Thienvu V Tran
(74) *Attorney, Agent, or Firm*—John P. O'Banion

(57) ABSTRACT

Source transistor configurations are described for reducing leakage and delay within integrated circuits. Virtual power and ground nodes are supported with the use of stacked transistor configurations, such as a two transistor stack between a first virtual supply connection and VSS, and a second virtual supply connection and VDD. Gate drives of these stacked transistors are modulated with different voltage levels in response to the operating power mode of the circuit, for example active mode, active-standby mode, and deep power-down mode. Means for driving these source stacks are described. In one embodiment separate virtual nodes are adapted for different types of circuits, such as buffers, row address strobe, and column address strobe. Other techniques, such as directional placement of the transistors is also described.

26 Claims, 20 Drawing Sheets

U.S. PATENT DOCUMENTS

| | | | |
|---|---|---|---|
| 6,307,805 B1 * | 10/2001 | Andersen et al. | 365/230.06 |
| 6,320,418 B1 * | 11/2001 | Fujii et al. | 326/93 |
| 6,556,071 B2 * | 4/2003 | Notani et al. | 327/544 |
| 6,573,937 B1 * | 6/2003 | Nakashiba | 348/314 |
| 6,759,873 B2 | 7/2004 | Kang et al. | |
| 2002/0141234 A1 | 10/2002 | Kaviani | |
| 2003/0132457 A1 | 7/2003 | Lee et al. | |
| 2004/0042257 A1 | 3/2004 | Lee et al. | |
| 2005/0035803 A1 * | 2/2005 | Furusawa et al. | 327/198 |

OTHER PUBLICATIONS

Chou, Sunlin "Integration and Innovation in the Nanoelectronics Era" IEEE International Solid-State Circuits Conference, vol. 1, pp. 36-41, January 2005.

Gopalakrishnan, Harish et al. "Leakage Power Reduction using Self-bias Transistor in VLSI Circuits" IEEE Workshop on Microelectronics and electron Devices, pp. 71-74, Apr. 16, 2004.

Chen, Zhanping et al. "DDQ Testing for Deep-Submicron ICs: Challenges and Solutions" IEEE Design & Test of Computers, pp. 24-33, Mar. 1, 2002.

* cited by examiner

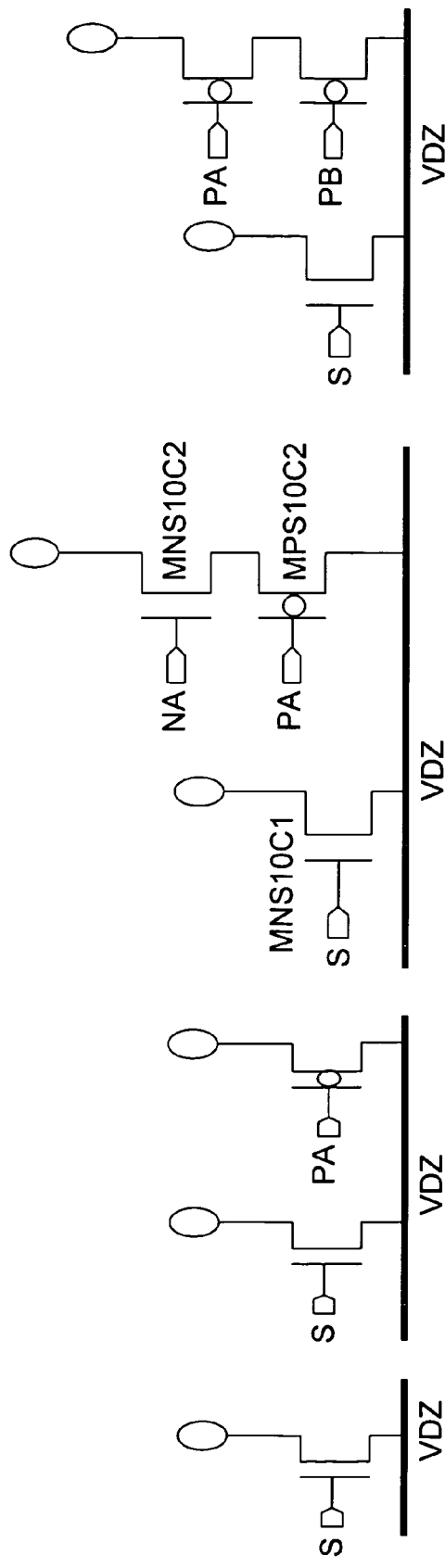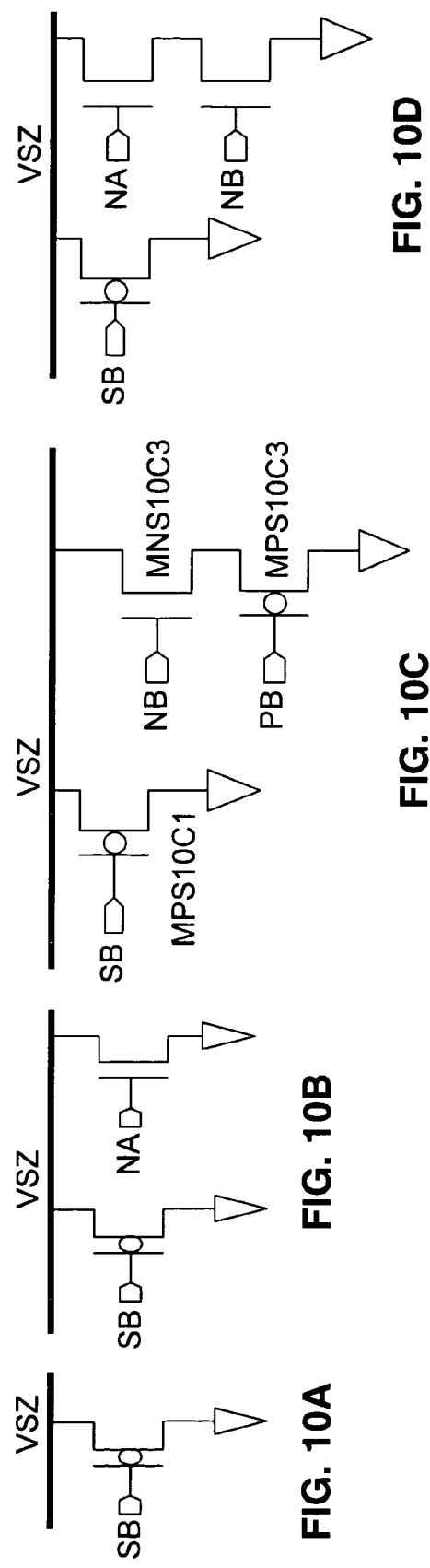
FIG. 10D
FIG. 10C
FIG. 10B
FIG. 10A

SOURCE TRANSISTOR CONFIGURATIONS AND CONTROL METHODS

CROSS-REFERENCE TO RELATED APPLICATIONS

This application claims priority from U.S. provisional application Ser. No. 60/697,672 filed on Jul. 8, 2005, which is incorporated by reference herein in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to integrated circuits, and more particularly to transistor source configurations and control methods for suppressing leakage current.

2. Description of Related Art

Leakage current is a critical parameter to be controlled and managed in fabricating ultra-deep sub-micron VLSI design. For example, in regard to 0.09 µm technology, leakage current is expected to comprise about 30~40% of total chip power consumption. One issue that arises for leakage suppression techniques in source transistors is fast recovery of the virtual power line level, when the chip is changed into active mode from standby mode, so as not to incur additional delay in chip operation. Other issues also arise in how to properly control source transistors according to their chip operating modes. Invention and Related Circuits.

FIG. 1A and FIG. 1B illustrate previous source transistor configurations for MTCMOS and a self-reverse biasing scheme, respectively.

FIG. 2 illustrates a timing diagram for the MTCMOS and self-reverse biasing schemes of FIG. 1A-1B. The advantage of the self-reverse biasing scheme over MTCMOS scheme is to suppress leakage current more by forming a self-reverse biased condition between a source transistor (MNS2) and a logic transistor (MPL2). For example, the leakage current can be suppressed by about three orders of magnitude with self-reverse biasing scheme while about one order of magnitude suppression with MTCMOS scheme.

For the MTCMOS scheme shown in active mode in FIG. 1A, the levels of SB1 and S1 as VSS and VDD, respectively, and the level of virtual power (VVDD1) is VDD as shown in FIG. 2. When the chip is in standby mode, SB1 goes to VDD and MPS1 is turned off. The level of WDD1 is lowered by VD1 due to the flow of leakage current MPL1. As the chip goes back to the active mode, SB1 goes to VSS and the lowered virtual power line level (VVDD1) is recovered to VDD when the source transistor is turned on after the level of SB1 goes lower than VDD−VTP (MPS1), where VTP(MPS1) is a threshold voltage of transistor MPS1.

For the self-reverse biasing scheme shown in FIG. 1B, which is similar to the MTCMOS scheme, the voltage level of power line (VVDD2) is lowered by VD2 due to the leakage current flowing through the logic transistor MPL2. The level of the virtual power line is recovered to VDD when the source transistor, MNS2, is turned on. The source transistor is turned on when signal S2 reaches a level of VDD−VD2+VTN (MNS2), where VTN(MNS2) is a threshold voltage of the source transistor, MNS2.

Even though the leakage current can be suppressed more significantly by utilizing the self-reverse biasing scheme, this delays the timing of when a source transistor is turned on to recover the power line level to VDD beyond MTCMOS by an amount represented as tD in FIG. 2. Note that the source transistor in the MTCMOS scheme is turned on at a level of VDD−VTP(MPS1) and at VDD−VDD2+VTN(MNS2) in self-reverse biasing scheme. In consequence to this delay in turning on the source transistor, additional power line recovery time can be required that leads to chip operating delays.

Accordingly a need exists for source transistor configurations and control methods which can achieve fast recovery of virtual power level and proper operations with minimum leakage current. These needs and others are met within the present invention, which overcomes the deficiencies of previously developed circuit configurations and methods.

BRIEF SUMMARY OF THE INVENTION

Circuits and methods are described for reducing leakage and increasing the speed of integrated circuits based on source transistor configurations and control methods. Configurations of stacked transistors provide source control and reduce leakage in standby modes while speeding discharge in active modes.

An aspect of the invention is the control of transistor leakage current in response to chip operating modes.

Another aspect of the invention is to provide fast virtual power recovery within circuit configuration and methods.

Another aspect of the invention is to provide fast recovery of virtual power line levels.

Another aspect of the invention is to provide self-reverse biasing techniques in combination with circuit to reduce leakage currents.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 10A-10D are schematics of transistor source configuration cases for which control signals are shown in Table 1.

DETAILED DESCRIPTION OF THE INVENTION

Referring more specifically to the drawings, for illustrative purposes the present invention is embodied in the apparatus generally shown in FIG. 3 through FIG. 20C. It will be appreciated that the apparatus may vary as to configuration and as to details of the parts, and that the method may vary as to the specific steps and sequence, without departing from the basic concepts as disclosed herein.

Figure 3:
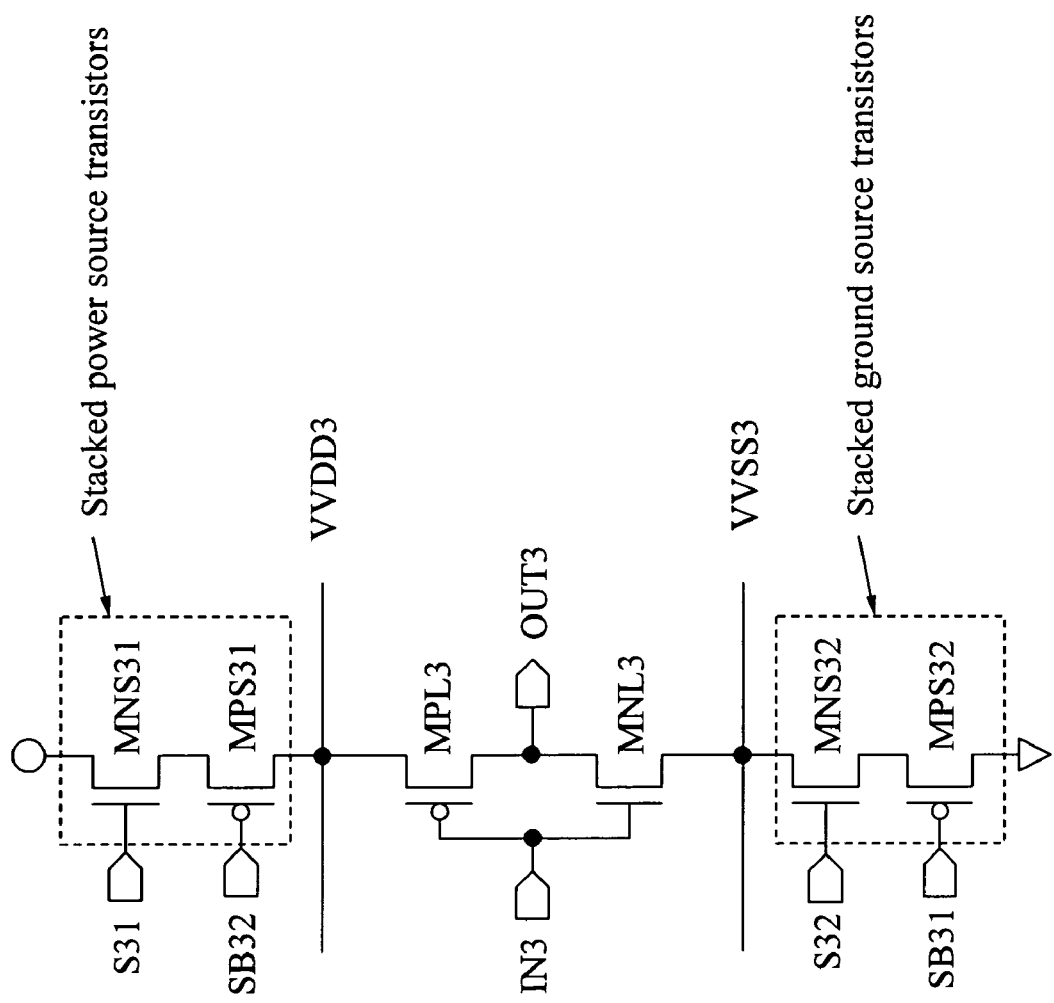
FIG. 3 is a schematic of a transistor configuration according to an aspect of the present invention, and referred to as configuration type 1.

FIG. 3 illustrates an embodiment of a source transistor circuit configuration and method according to an aspect of the present invention for addressing the slow power line recovery time of the power line level. An embodiment of this configuration is composed of stacked source transistors such as transistors MNS31 and MPS31, as well as transistors MNS32 and MPS32.

Figure 4:
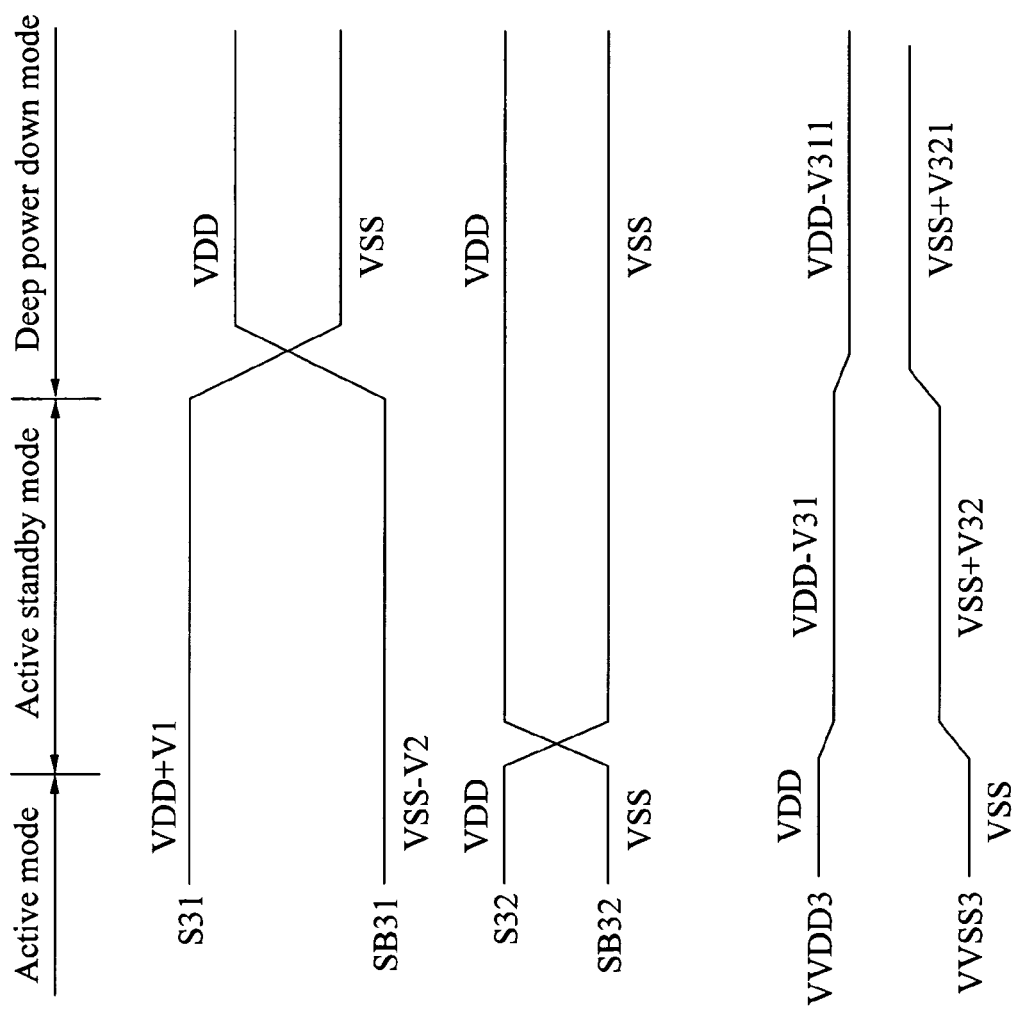
FIG. 4 is a timing diagram for control signals and node voltage levels of the type 1 configuration of FIG. 3.

FIG. 4 illustrates control signal and node voltage levels of the proposed circuit for different operating modes. In active mode, in order to transfer the full VDD and VSS level without any Vt voltage drop gate signals S31 and SB31 are boosted to a level of VDD+V1 and a level of VSS−V2, respectively. Since there is no voltage drop with a PMOS and an NMOS transistor in transferring full VDD and VSS levels, signals SB32 and S32 have a level of VSS and VDD, respectively. So, the power line voltages in active mode are given by VDD and VSS, respectively.

An active-standby mode requires a shorter time to return to the normal active mode while the level of current consumption of this operating mode is usually much larger than that of so-called deep power down mode. In this mode while the on-state of NMOS power (MNS31) and PMOS ground (MPS32) transistors are retained, other power source transistors such as MPS31 and MNS32 are turned off to block leakage current. In this configuration, due to the leakage current flowing through MPS31 as in the MTCMOS scheme, the virtual power line voltage (VVDD3) is lowered by V31 and similarly, VVSS3 is raised by V32. Note that in this configuration the amount of voltage drop and raise is relatively small since only logic transistors are reverse-biased.

In deep power down mode, S31 and SB31 go to VSS and VDD, respectively, in order to turn off MNS31 and MPS32 to make all transistors reverse-biased by V311 and V321, respectively as shown in FIG. 4. It should be appreciated that the supply voltage excursion associated with deep power down mode is greater than in active-standby mode since all transistors are reverse-biased in deep power down mode while only logic transistor are reverse-biased in standby mode.

Figure 5:
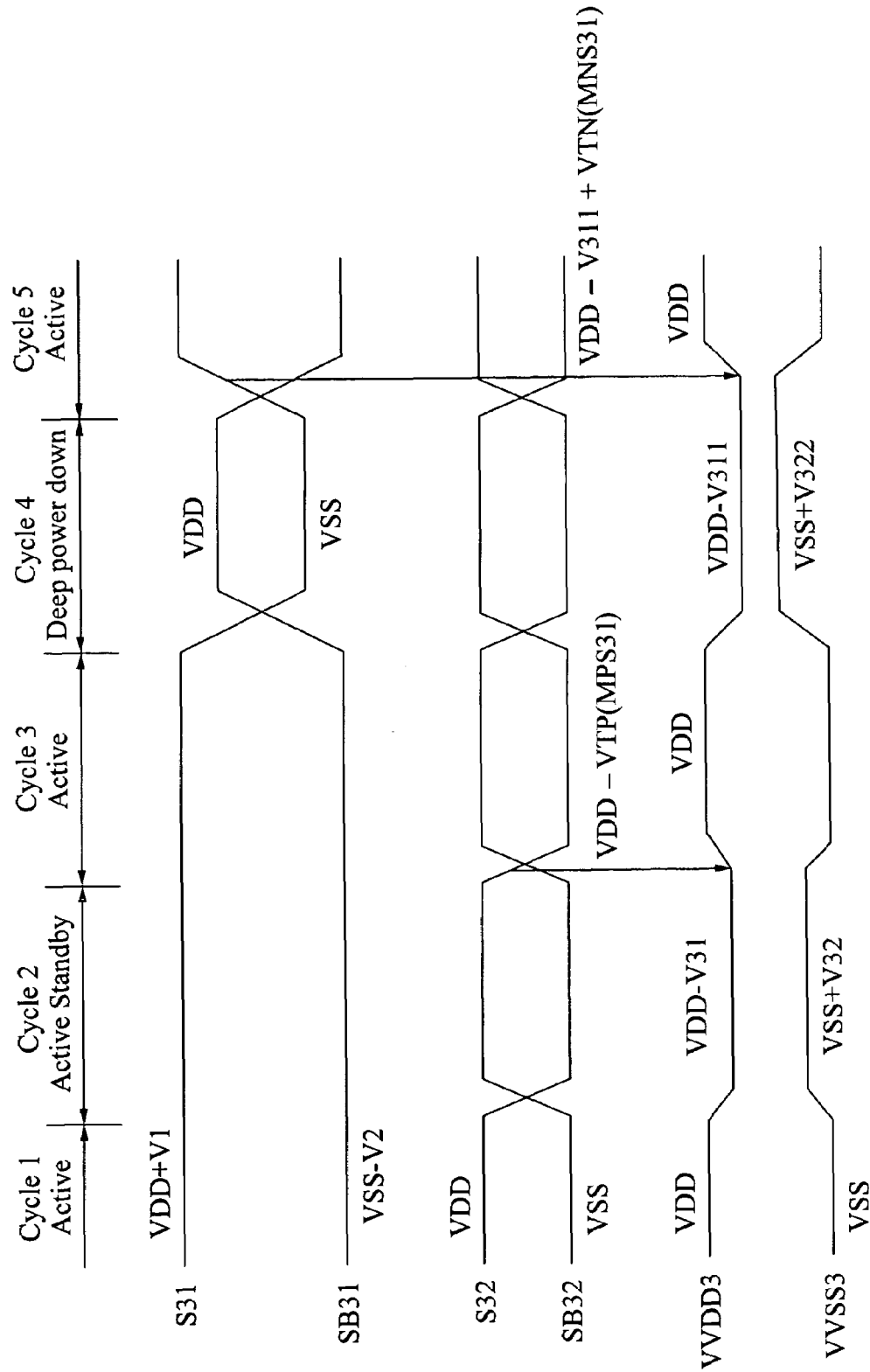
FIG. 5 is a timing diagram for control signals and node voltage levels of the mixed operating modes configuration in reference to FIG. 3 according to an aspect of the present invention.

FIG. 5 illustrates control signal and node voltage levels of a circuit for mixed operating modes. Referring to the figure, in cycle 2 since the signal combination is for active-standby mode, the virtual power line is dropped and raised by V31 and V32, respectively.

When the chip mode changes from active-standby mode to active mode in cycle 3, since transistors MNS31 and MPS32 are turned on and transistors MPS31 and MNS32 are necessarily turned on, then when SB32 reaches a voltage of VDD−VTP(MPS31), transistor MPS31 starts to turn on and recover the lowered voltage level to VDD from VDD−V31. Similarly, when signal S32 reaches voltage VTN(MNS32), where VTN (MNS32) is a threshold voltage of transistor MNS32, VVSS3 is recovered to VSS.

When the chip goes into deep power down mode as in cycle 4, the virtual power line voltages are lowered and raised by voltage transitions V311 and V321, respectively.

In cycle 5, when the chip returns to active mode from deep power down mode, the MNS31 starts to turn on when S31 reaches at a voltage of VDD−V2+VTN(MNS31) and the virtual power line can be recovered to VDD. Differently from active-standby mode, the hetero-source transistors (NMOS source transistor at power node and PMOS source transistor at ground node) are turned on later when the chip operation is changed from deep power down mode to active mode than homo-source transistors (PMOS source transistor at power node and NMOS source transistor at ground node) are turned on when the chip operation is changed from active-standby mode to active mode.

Figure 6:
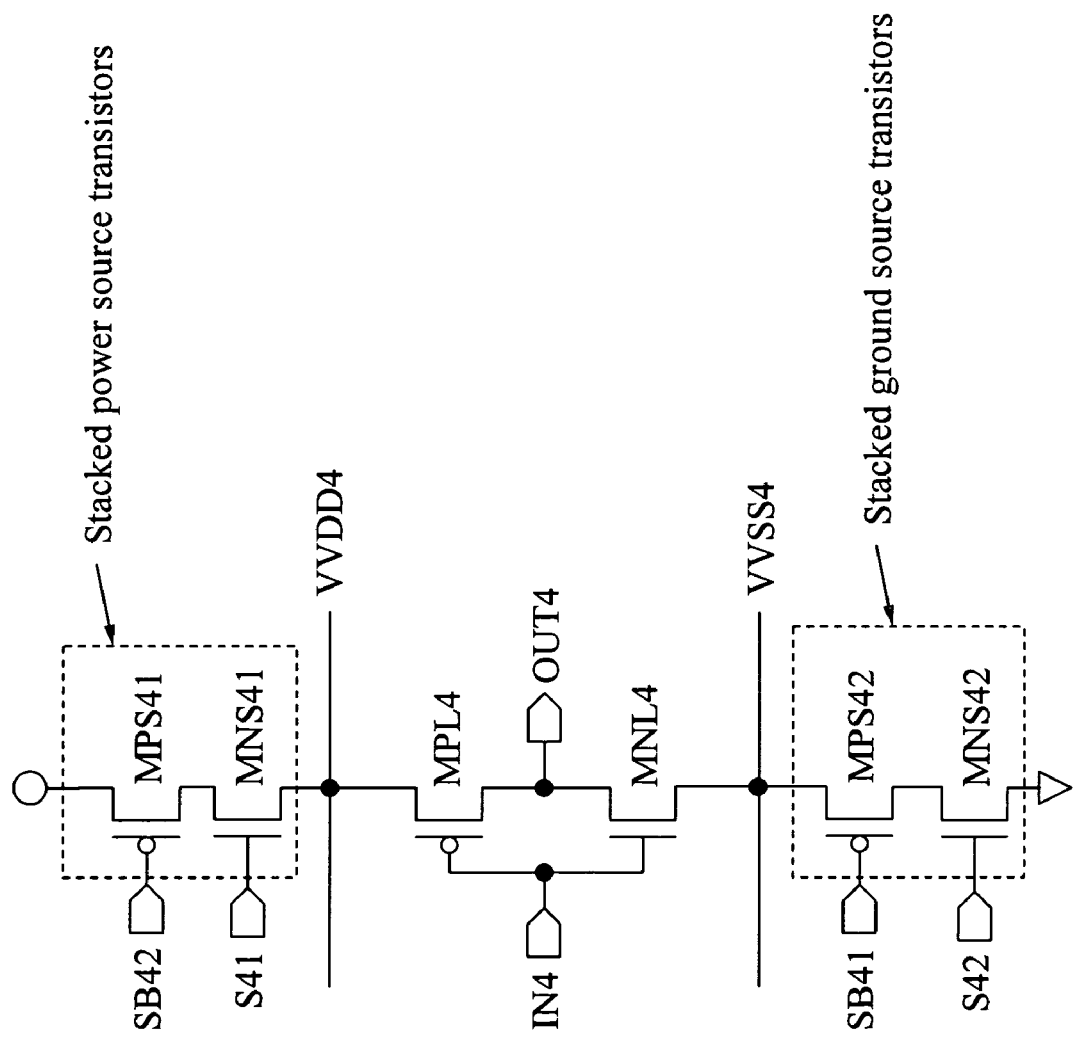
FIG. 6 is a schematic of a transistor configuration according to an aspect of the present invention, and referred to as configuration type 2.

FIG. 6 illustrates another configuration of stacked source transistors according to another implementation of the present invention for accelerating activation of homo-source transistors.

Figure 7:
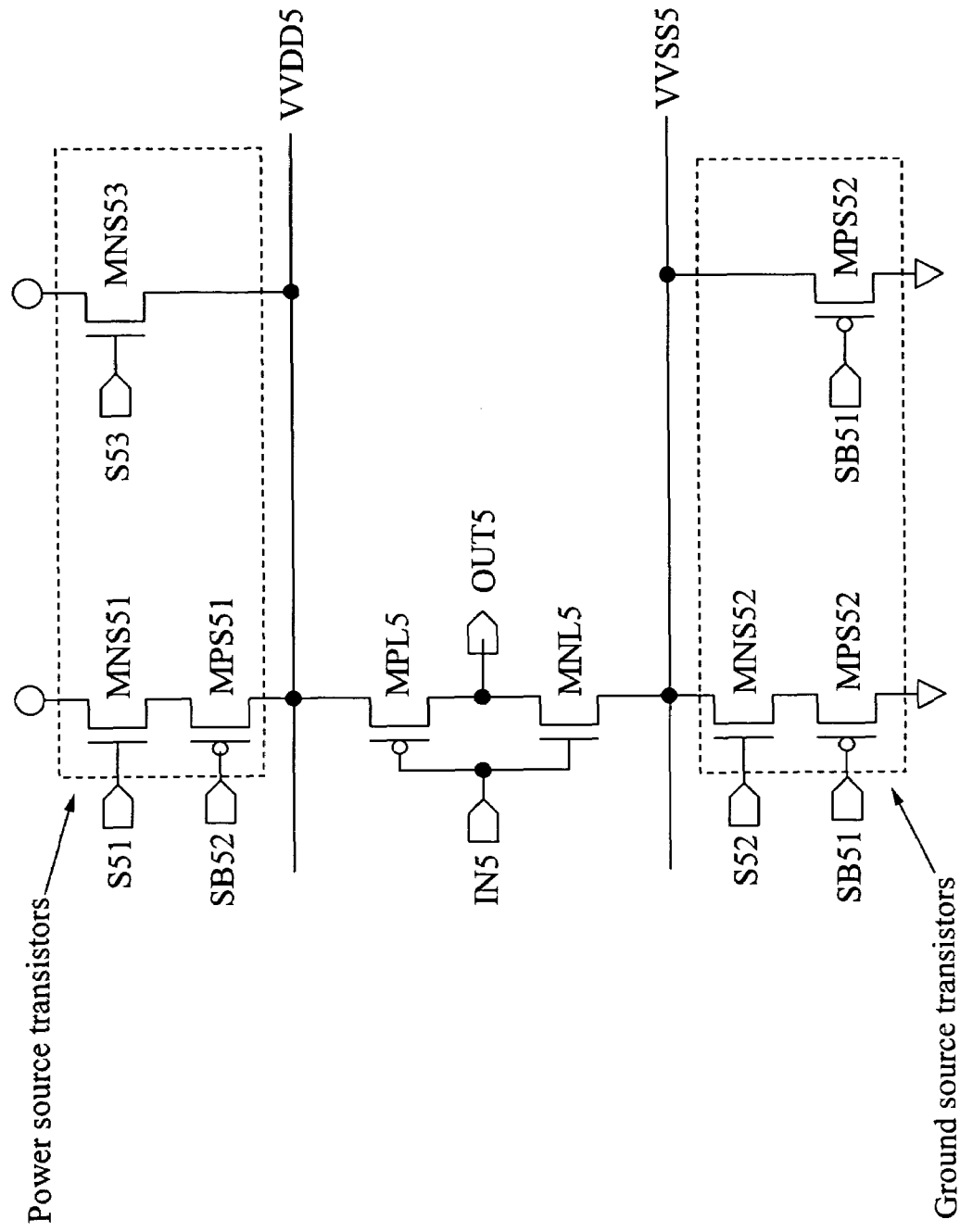
FIG. 7 is a schematic of a transistor configuration according to an aspect of the present invention, and referred to as configuration type 3.

FIG. 7 illustrates another stacked source transistor configuration according to an implementation of the present invention for increasing the current driving capability in active mode by activating hetero-source transistors such as transistors MNS53 and MPS52 only when in active mode.

Figure 8:
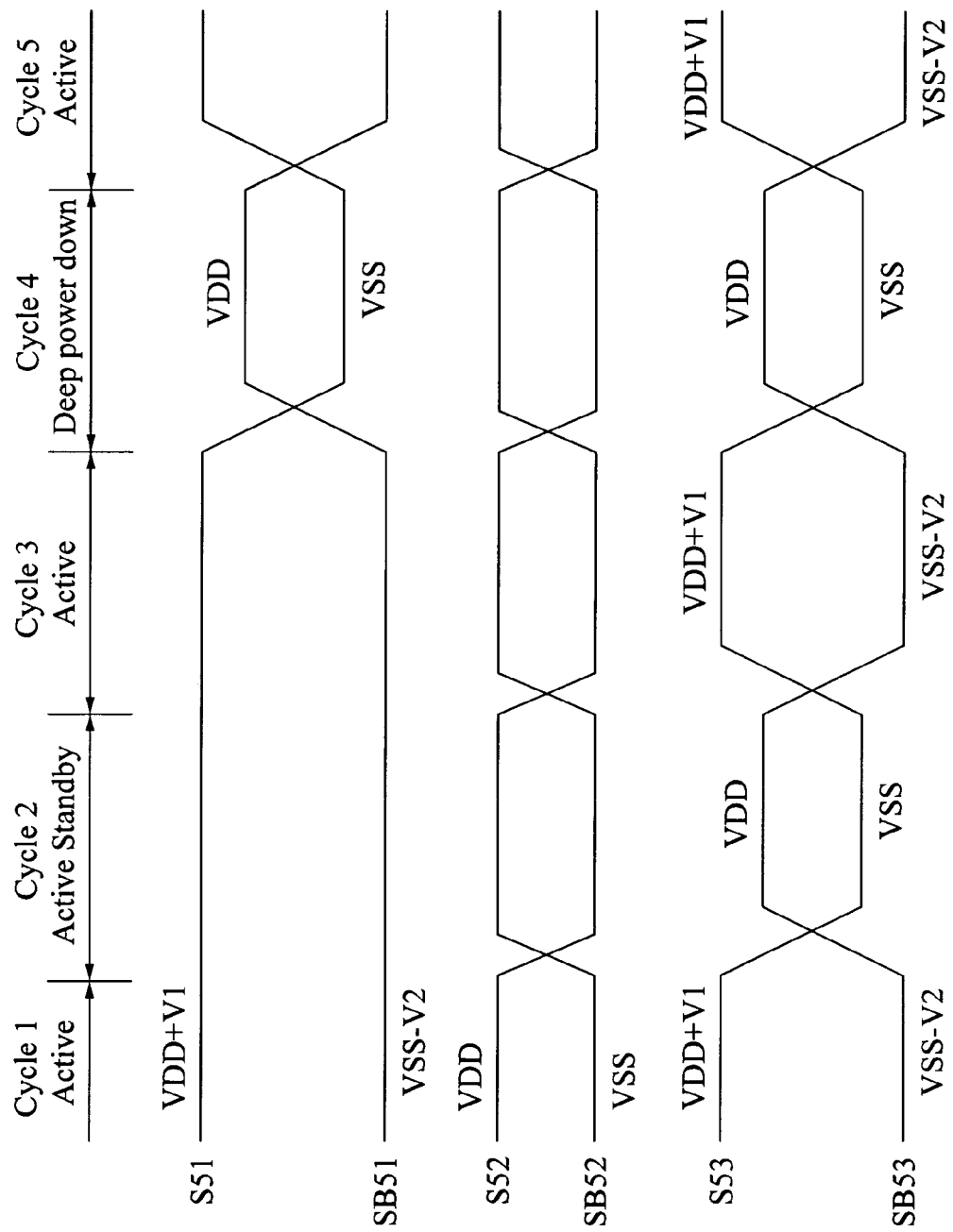
FIG. 8 is a timing diagram for control signals and node voltage levels of the mixed operating modes configuration in reference to FIGS. 6 and 7 according to an aspect of the present invention.

FIG. 8 depicts timing diagrams for the configuration shown in FIG. 7.

Figure 9:
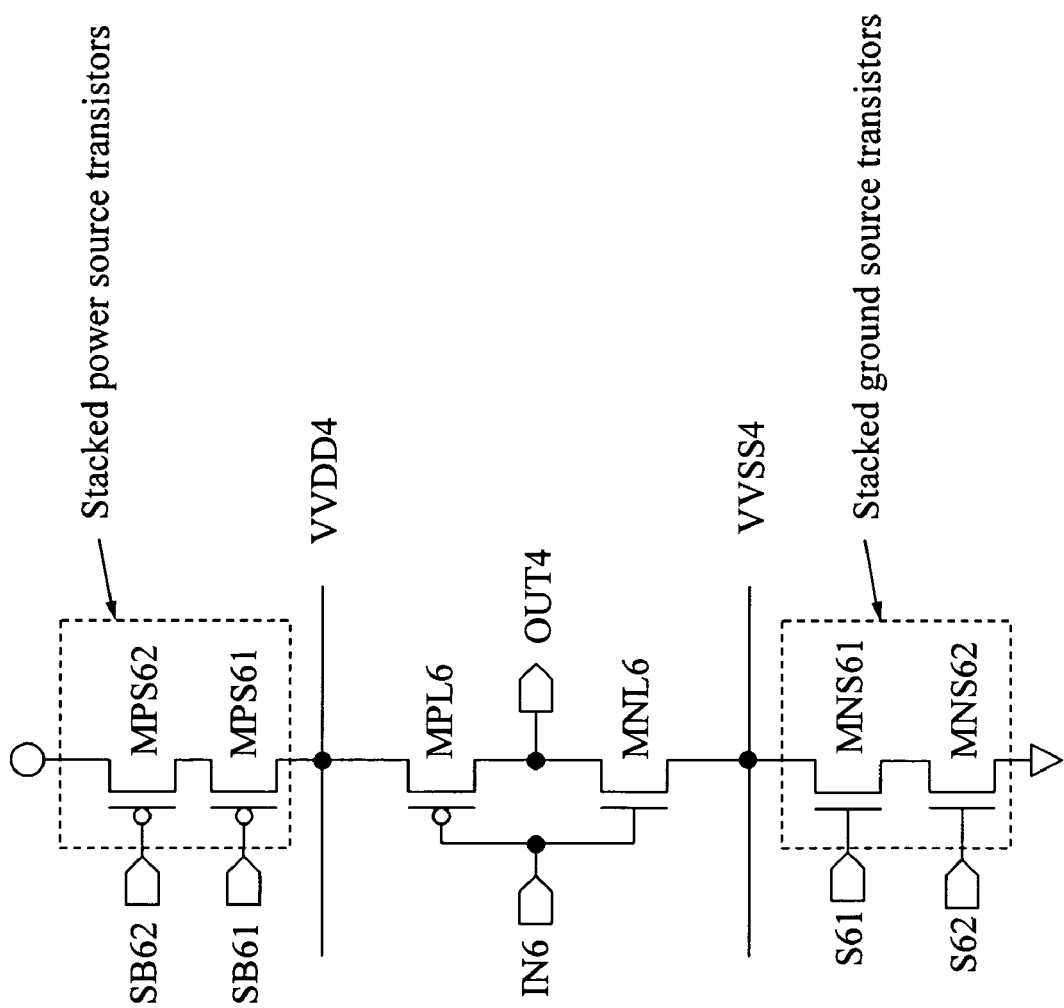
FIG. 9 is a schematic of a transistor configuration according to an aspect of the present invention, and referred to as configuration type 4.

FIG. 9 illustrates stacked source transistor configurations with homo transistors and different control signals. One advantage of this configuration is how readily it can be layed out by putting the same type of transistors between the power and virtual power lines.

FIG. 10A-10D illustrate the use of different source transistors configurations to accomplish gating as described in the following sections. Table 1 illustrates examples of virtual power line separation and control methods for different types of source transistors.

Figures 1A, 1B:
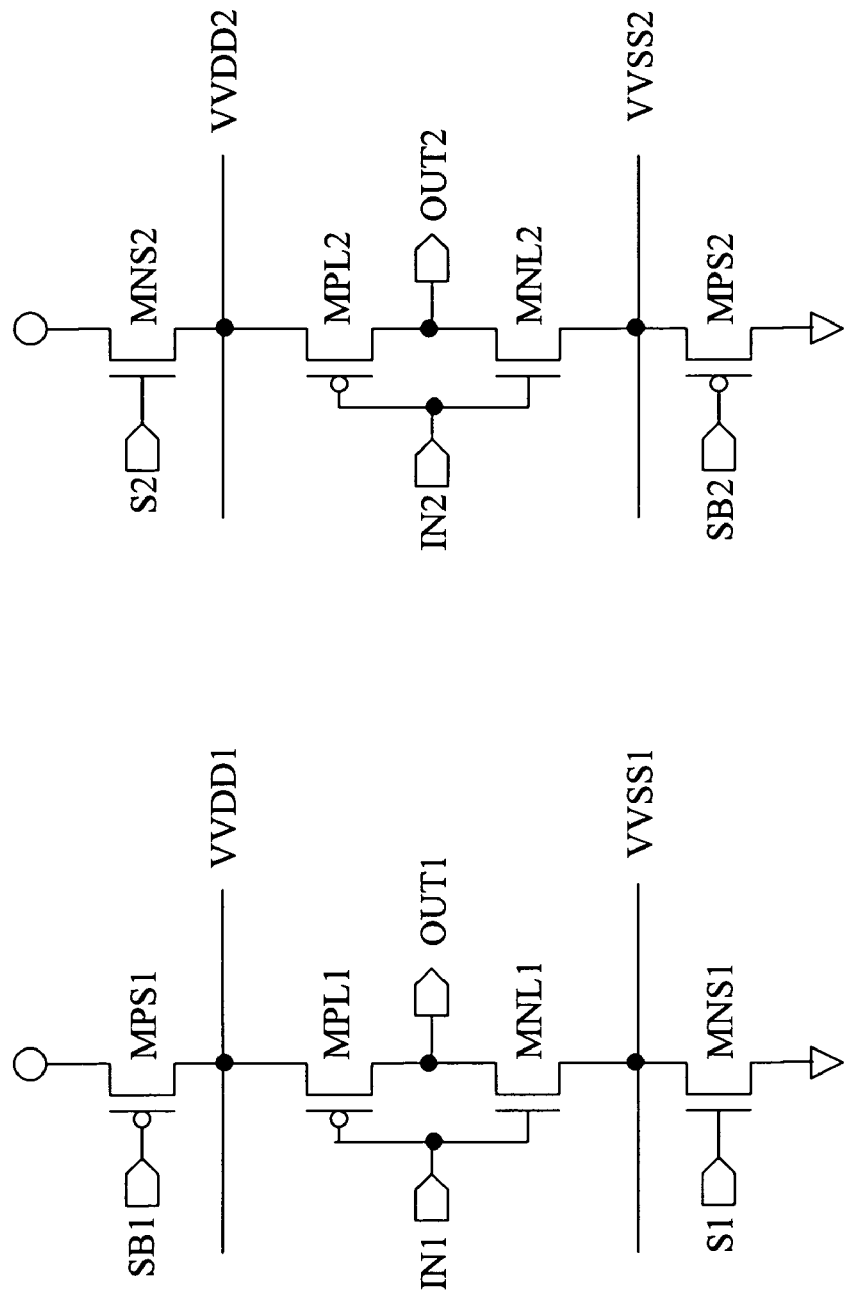
FIG. 1A is a schematic of a conventional MTCMOS leakage current suppression technique.
FIG. 1B is a schematic of a conventional self-reverse biasing leakage current suppression technique.
Figure 2:
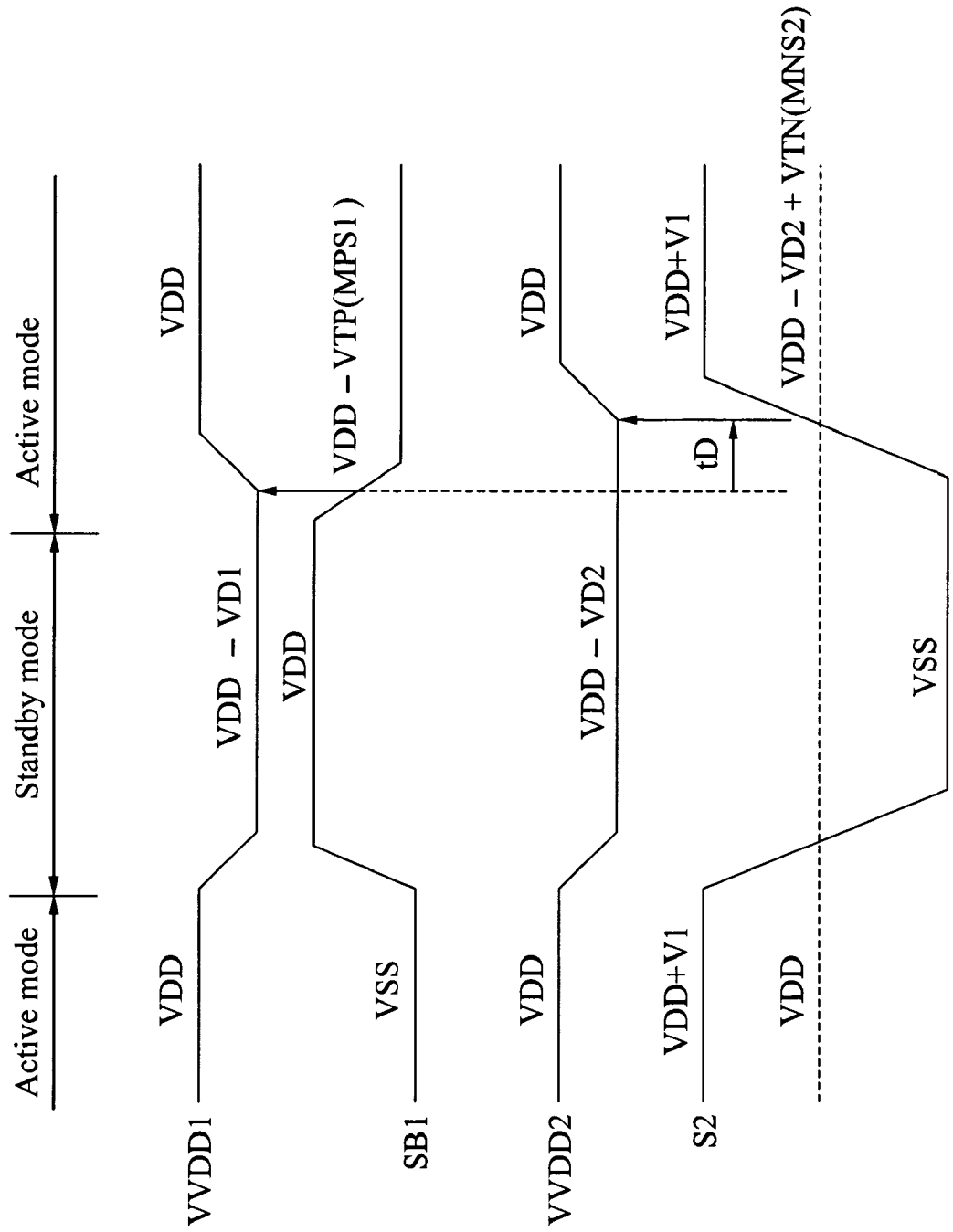
FIG. 2 is a timing diagram which illustrates the timing delays in response to mode changes in the conventional MTCMOS and self-reverse biasing configurations shown in FIG. 1A-1B.

FIG. 10A and FIG. 10B illustrate conventional source transistor configurations in conjunction with FIGS. 1A, 1B and 2. In FIG. 10A the first two signal columns S and SB are referenced. In FIG. 10B the first four signal columns S, SB, PA and NA are referenced.

FIG. 10C and FIG. 10D illustrate the source transistor configurations and control signals according to aspects of the invention as discussed above. Table 1 provides a list of control signal levels according to these different circuit modes. In FIG. 10C case 3 represents case 3 of the present invention as described in relation to type 1, type 2, and type 3 and FIGS. 3, 6 and 7. FIG. 10D shows case 4 which is described in relation to type 4 and FIG. 9. All six columns of Table 1 are referenced for case 3 and case 4.

It is assumed that virtual power lines are divided into three groups, BUF (buffer), RAS (row-address strobe) and CAS (column-address strobe). The combinational source transistor configuration shown in FIG. 10C is connected to a virtual power line. In the active mode shown in the second column of Table 1, gate voltages of single NMOS and PMOS power and ground source transistor, MNS10C1 and MPS10C1, are VPPZ and VBBZ, respectively, where VPPZ and VBBZ are respectively higher and lower voltages than the chip power and ground voltages so as to fully transfer the chip power and ground voltage to a virtual power and ground line, respectively. The level of the gate control signal (PA) of transistor MPS10C2 can be at level VBBZ or VSS and the level of the gate control signal (NA) of transistor MNS10C2 can be either at level VPPZ or VDD. The level of the gate control signal (PB) of transistor MPS10C3 can be at level VBBZ or VSS, and the level of the gate control signal (NB) of transistor MNS10C3 being either VPPZ or VDD. Similarly, in active power down mode, the gate signals of source transistors connected to a virtual power line of BUF group, S, SB, PA, NA, PB and NB, can have a voltage level of VSS, VDD, VDD, VSS, VDD and VSS, respectively. The gate signals of source transistors connected to a virtual power line of the RAS group can have a voltage level of VPPZ, VBBZ, VBBZ (or VSS), VPPZ (or VDD), VBBZ (or VSS) and VPPZ (or VDD), respectively. The gate signals of source transistors connected to a virtual power line of CAS group can have a voltage level of VSS, VDD, VDD, VSS, VDD and VSS, respectively.

It should be appreciated that the different source transistor configurations and control methods can include the following aspects (a-e) either separately or in various combinations.

(a) Virtual power line voltage can be controlled to attain different voltage levels for different operating modes, including at full VDD voltage in active mode, a certain voltage level in active-standby mode to provide more rapid recovery time, and another level in deep power down mode to suppress leakage current significantly.

(b) Virtual ground line voltage can be controlled similarly to virtual power line.

(c) Source and logic transistors can be turned-on fully in active mode, with only homo-source transistors turned-on in active-standby mode, and with both homo and hetero source transistors turned off in deep power down mode.

(d) Different types of source transistors (homo and hetero) can be stacked and controlled to achieve a fast recovery time.

(e) Homo-source transistors can be controlled by a boosted voltage, and can be fabricated using either thick or thin oxide transistors.

A number of different source transistor configurations and control methods can be implemented for different chip operating modes and applications. For example, in DRAM operation, CAS (Column Address Strobe) chain circuits which usually control data transfer from memory cells to the chip output buffer are activated after RAS (Row Address Strobe) circuits finish their functions. So, there is some timing interval in the activation of RAS and CAS circuits. One technical issue with using source transistors is a fast recovery of virtual power lines such as WDD1 and WSS1 in FIG. 1A when the chip operating mode is changed from a standby or an active-standby mode to an active mode not to cause any chip speed delay. Accordingly, the reduction of the load capacitance of the virtual power line is critical for shortening the recovery time. Therefore one feature of this invention is the separation, or division, of virtual power lines according to operating paths such as RAS, CAS chain, buffer, clock, and so forth. Since buffer circuits provide an interface to receive external data and convert an external signal level into an on-chip signal level, such circuits should be separated to offer a minimum load capacitance to the virtual power line.

It should also be appreciated that these virtual power lines can be divided and separated for memory banks with an operation path, since memory banks can operate at a different time and the separation of virtual power lines will be useful for supporting a high speed memory operation.

The use of control signals for DC generators to control virtual power lines is another aspect of this invention. Notice that placement of different types of stacked or combinational source transistors can be utilized separately or in combination on the power line or hetero or homo transistors will be placed on the power line to increase current driving capability in active mode.

Another example of power line separation in DRAMs can be implemented using different groups depending on functions. By way of example and not limitation, the first group can include circuits containing command and address buffers, the second group can include CKE (Clock Enable) buffer, the third group including RAS chain circuits, and a fourth group including CAS chain and Din circuits, and so forth.

Figure 11:
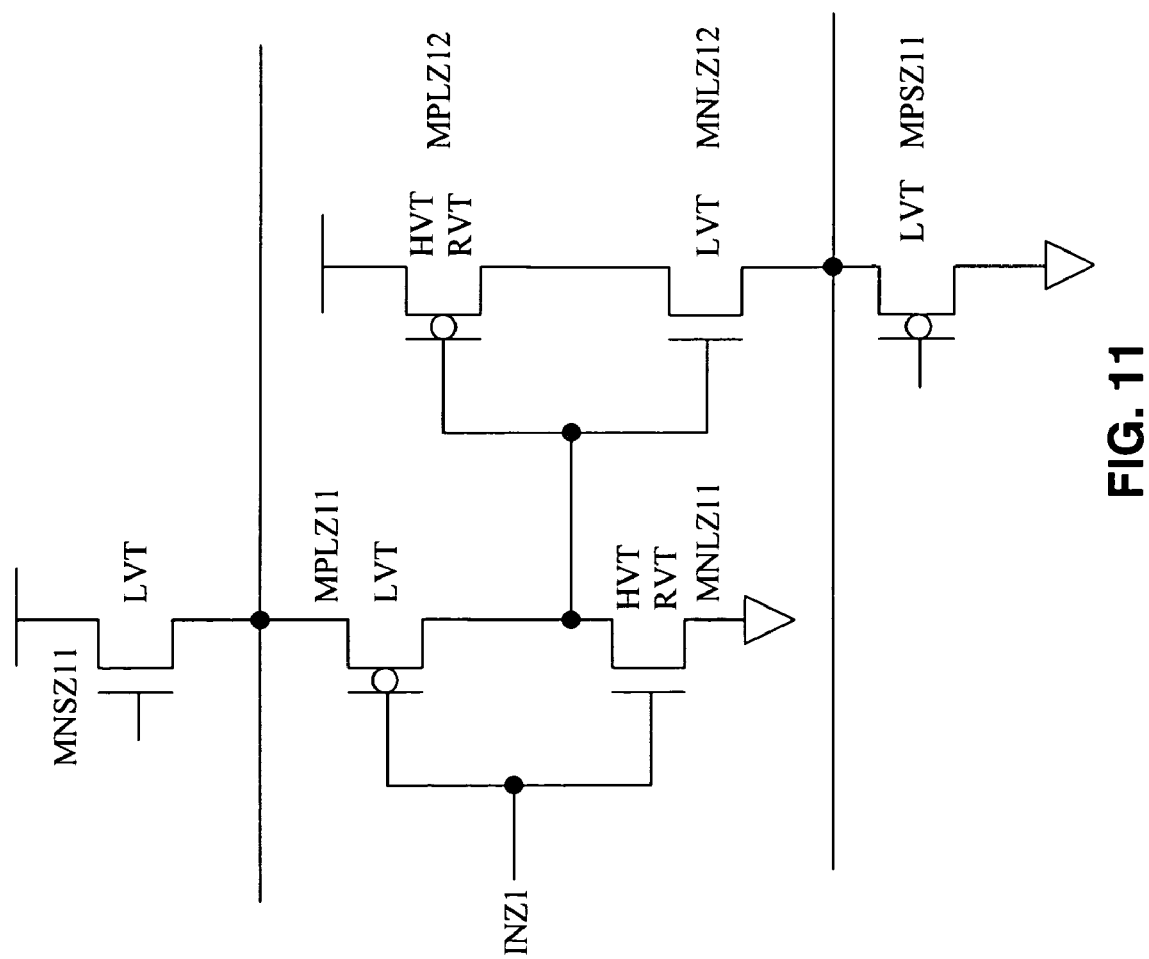
FIG. 11 is a schematic showing directional placement of transistors to reduce leakage current in active-standby mode according to an aspect of the present invention.

FIG. 11 illustrates an aspect of the invention referred to as directional placement of transistors toward reducing leakage current in an active-standby mode while improving circuit speed. Transistors in various combinations, such as single transistors, stacked transistors, or a combination of source transistors, such as low Vt transistors MNSZ11 and MPSZ11 can be used to improve speed. It is assumed that a state of input (INZ1) and an internal node (NZ11) is high while in active mode. Therefore, source transistors, MNSZ11 and MPSZ11, and logic transistors MPLZ11 & MNLZ12, are turned on. Notice that transistors which are turned-on in active mode have low threshold voltages to improve speed. When the chip is in active mode and there is no chip operation because the input of the chip remains the same, it is considered to be in active-standby mode. Often leakage current flowing through turned-off transistors can be an issue while in active-standby mode. According to a mode of the present invention, higher threshold voltages are used for those transistors which are turned off in active-standby mode to reduce this leakage current.

In standby mode, since the source transistors and logic transistors are turned off, leakage current can be suppressed below that of active-standby mode. Consequently, higher speeds can be obtained while at the same time suppressing leakage current through the use of directional placement of logic transistors with source transistors as taught herein.

Figure 12:
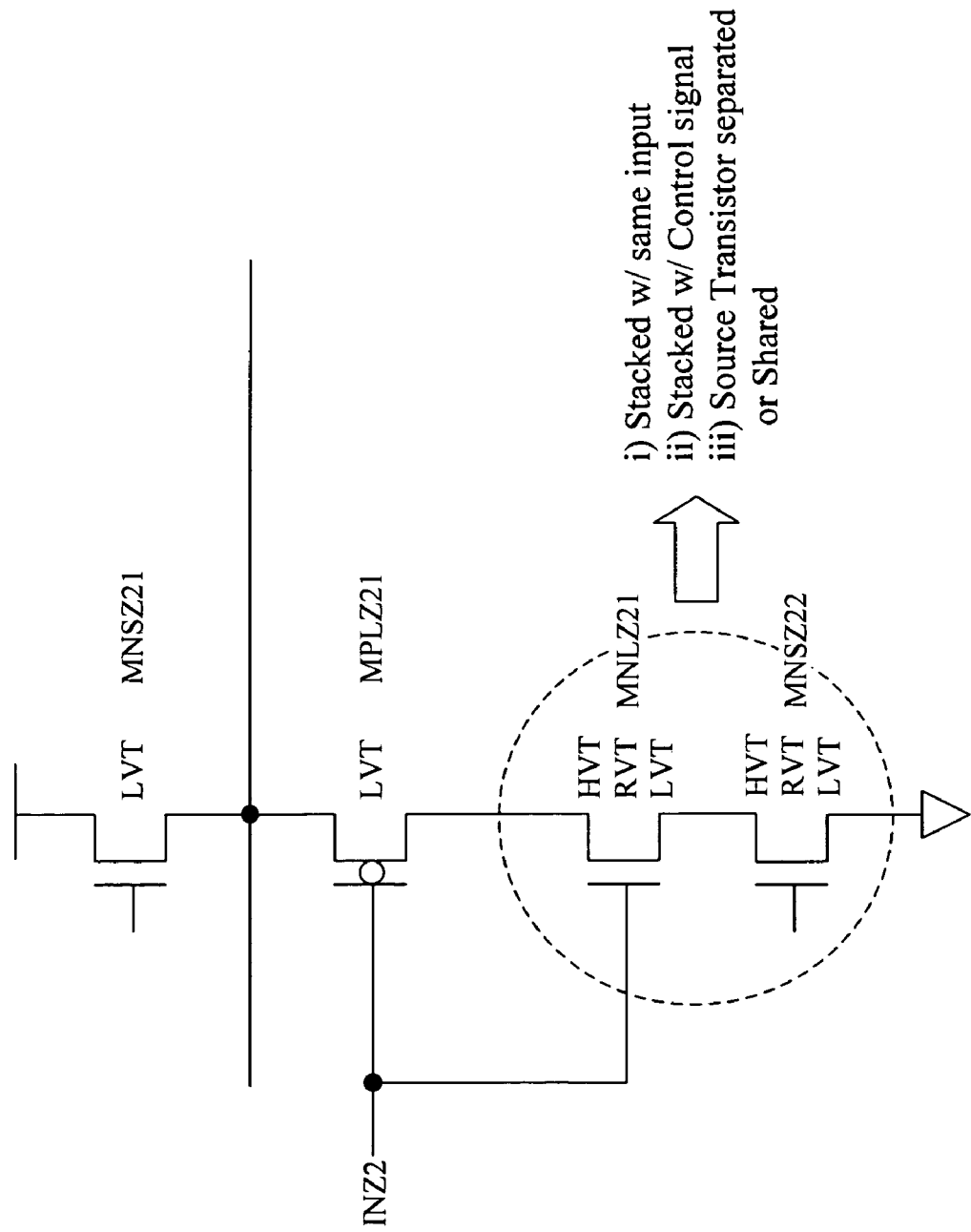
FIG. 12 is a schematic showing directional placement of transistors to reduce leakage current in active and active-standby modes according to an aspect of the present invention.

FIG. 12 illustrates another aspect of the invention utilizing directional placement of transistors. In this aspect, a low Vt NMOS source transistor, MNSZ21, is turned on in active mode and active-standby modes. When input, INZ2 is low, the output OUTZ2, is high and the use of a low Vt logic transistor in the active path improves speed. However, the leakage current flowing through turned-off logic transistor MNLZ21 is an issue. Accordingly, the use of a higher Vt logic transistor for MNLZ21 is effective toward suppressing this leakage current.

In this invention, the use of another transistor, MNSZ22, which is stacked with the logic transistor and connected to the input or controlled by another signal can suppress leakage current in active mode and active-standby mode. Such additional transistors can be linked with a logic transistor separately, shared with other logic transistors, or can be implemented having different threshold voltages. One potential issue with this structure is a delay arising with precharge speed. After the chip operating mode is changed from active mode and precharge mode, the input INZ2, goes to high and the logic transistor MNLZ21 is turned on. If the transistor MNSZ22 has smaller current driving capability and a higher Vt, the precharge speed can be delayed.

Figure 13:
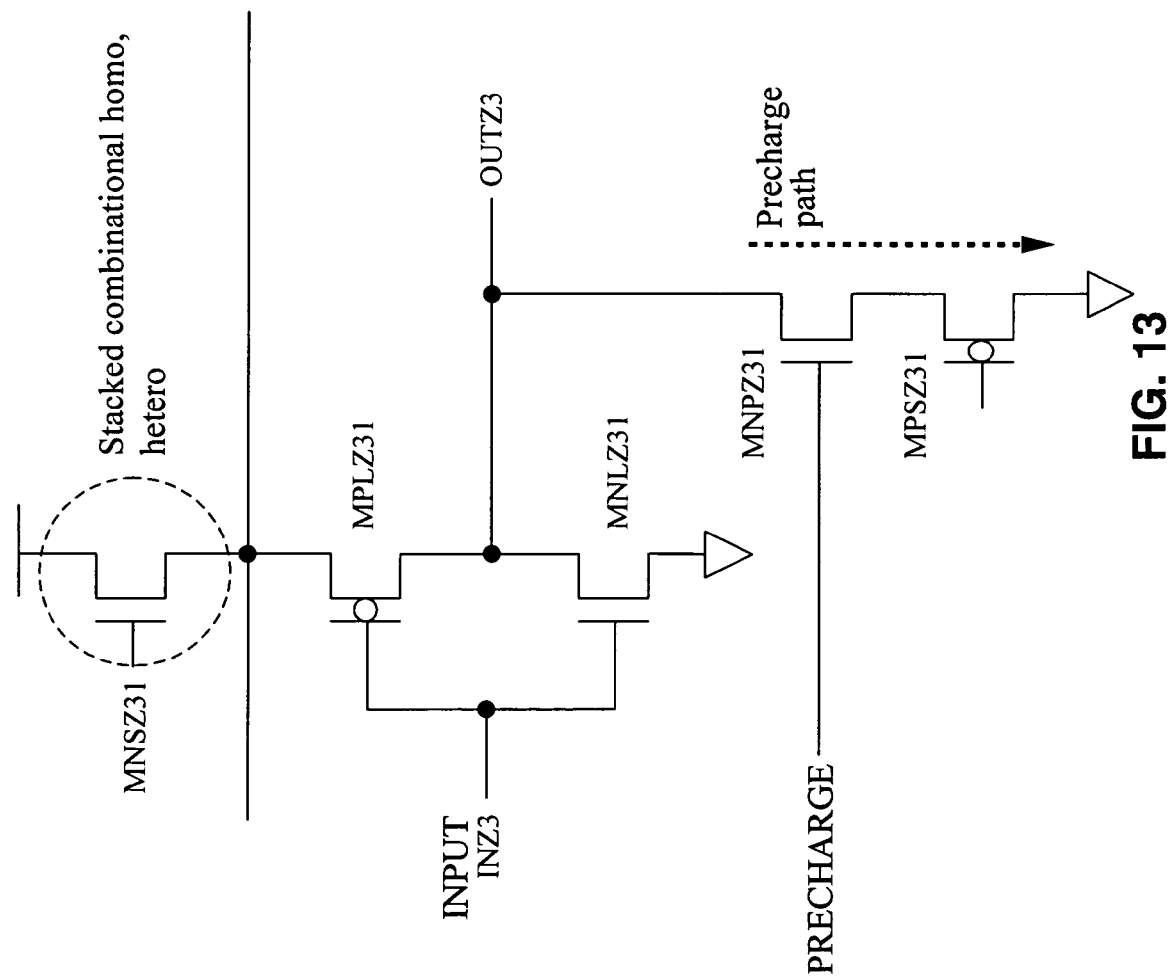
FIG. 13 is a schematic showing directional placement of transistors to increase discharge rate active mode according to an aspect of the present invention.

FIG. 13 illustrates another embodiment of directional placement of different types of transistors in a circuit structure using source transistors to decrease discharge interval and thus increase discharge speed. In active mode, a source transistor MNSZ31 is turned on. It should be appreciated that different types of single, stacked, or combination, of homo and hetero source transistors can be utilized to increase discharge speed. When input INZ3 is low, a logic transistor MPLZ31 is turned on, and the output OUTZ3 is high. In order to suppress leakage current, the size of discharging transistor MNLZ31, needs to be small. In a precharge cycle, the output OUTZ3 is required to be discharged to low. However, since the current driving capability of the discharging transistor is small, the discharging speed is much slower than the speed to charge the output. In this invention, another discharging path which is connected with a source transistor MPSZ31, is used to increase the discharge speed. When the discharge path is not enabled, MPSZ31 is turned off and the level of signal PRECHARGE, is low and therefore, a self-reverse biased condition between MNPZ31 and MPSZ31 is formed and leakage current is suppressed significantly. When the discharging path is used to discharge the transistors having large current driving capability in the discharge path are turned on and the discharging speed can be improved.

Source transistors connected to a virtual node can be controlled effectively depending on the chip operation. Since CAS chain circuits are activated later than RAS chain circuits, CAS chain circuits can be controlled by a signal with information that a certain operation of RAS chain is completed. Source transistors can also be controlled depending on different chip operating modes. For example, in standby mode virtual power and ground line levels can be lowered and raised, respectively, more than when in active-standby mode.

Another example of utilizing the combinational source transistor is within the bit-line sense amplifier for a DRAM chip. A hetero source transistor, for example, a PMOS source transistor connected to an NMOS logic transistor, can be used in a DRAM bit-line sense amplifier to be controlled to have different virtual ground levels for different operating modes. In self refresh mode, the hetero ground source transistor is turned on instead of the homo ground source transistor to raise the virtual ground level by Vtp and it makes the gate-to-source voltage of DRAM memory cell access transistor reverse biased by Vtp for the memory cell having data 1 and suppresses leakage current flowing through the access transistor, and accordingly the memory cell retention time can be increased. In such a configuration used in the DRAM bit-line sense amplifier, the gate of the homo NMOS source transistor can have a boosted voltage level to increase current driving capability.

Similarly, NMOS hetero and PMOS homo source transistors can be used for the power source transistor and can be controlled differently according to chip operating modes. In active mode, NMOS and (or) PMOS source transistors can be turned on to increase current driving capability of source transistors. In self refresh mode, only the NMOS hetero source transistor is turned on and the level of the virtual power line can be lowered by Vtn, where Vtn is a threshold voltage of NMOS hetero source transistor. By lowering the virtual power line level, power consumption due to bit-line charging and discharging can be reduced by reducing voltage swing.

Figure 14:
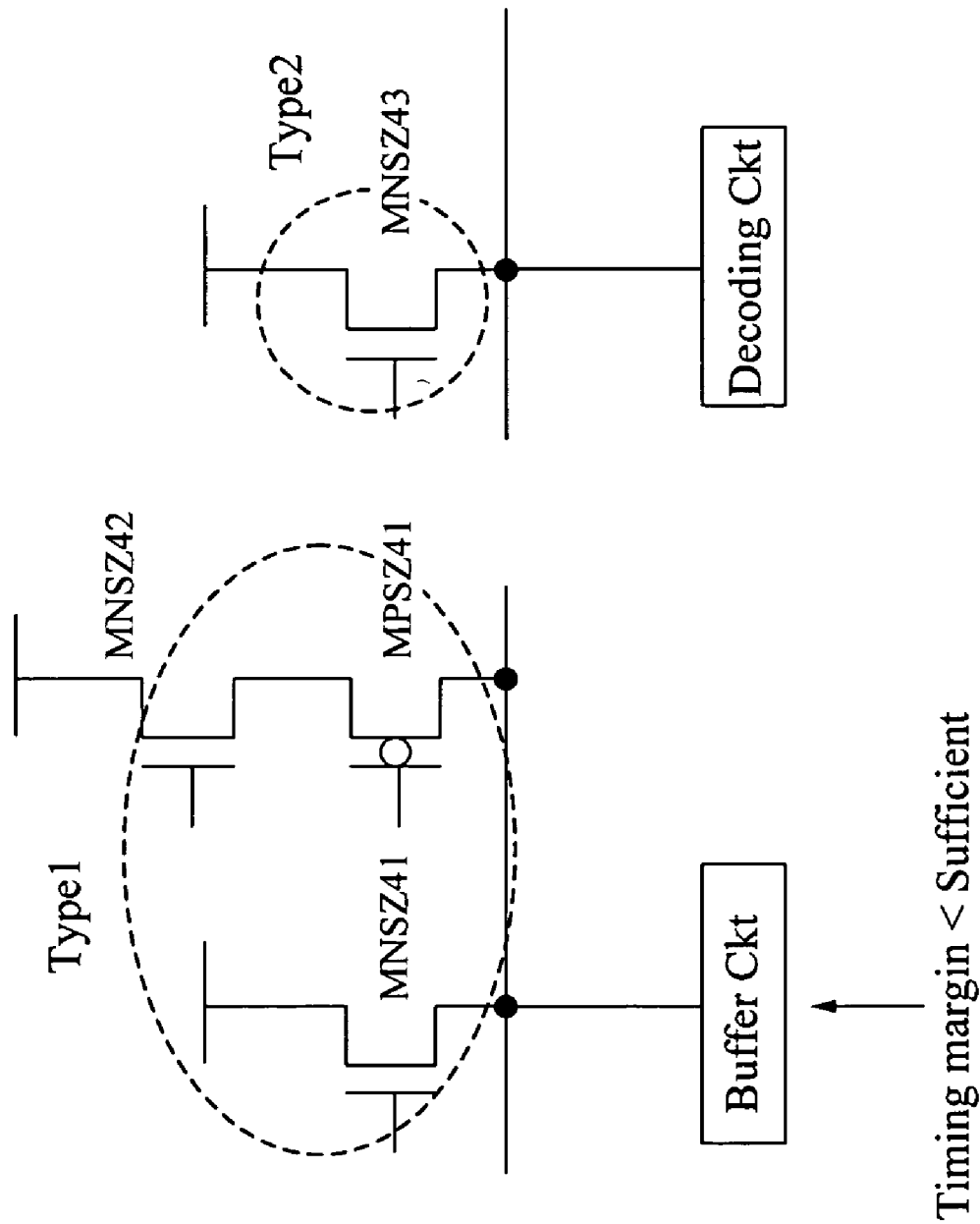
FIG. 14 is a schematic source transistor configurations dependent on timing margins showing fast recovery according to an aspect of the present invention.

FIG. 14 illustrates the use of different source transistor configurations depending on timing margins, such as a wake-up time. For a circuit which requires a fast recovery, such as a buffer circuit, a combinational source transistor configuration which is composed of a single power source transistor MNSZ41, and stacked power source transistors MNSZ42 and MPSZ41, can be used. However, for a circuit with timing margin, such as an address decoding circuit, a simple single power source transistor MNSZ43, can be used.

A gate control signal which is higher than the chip operating voltage can be controlled to provide multiple states. For example, the control signal S in FIG. 10C can be boosted from the ground voltage VSS to the power voltage VDD and the boosted voltage VPPZ by different voltage sources. Similarly, a gate control signal which is lower than the chip operating voltage can be controlled to provide multiple states. For example, the control signal SB in FIG. 10C can be lowered from the power voltage VDD to the ground voltage VSS and the boosted (lowered) voltage VBBZ by different voltage sources.

In designing the chip to effectively utilize source transistors as taught herein, a different design methodology is preferably utilized to determine source transistor size and types earlier in the design process for different chip operating modes.

Another feature of the invention is circuits and methods to rapidly turn on source transistors and not to induce any chip speed delay by using an asynchronous command signal.

Figure 15:
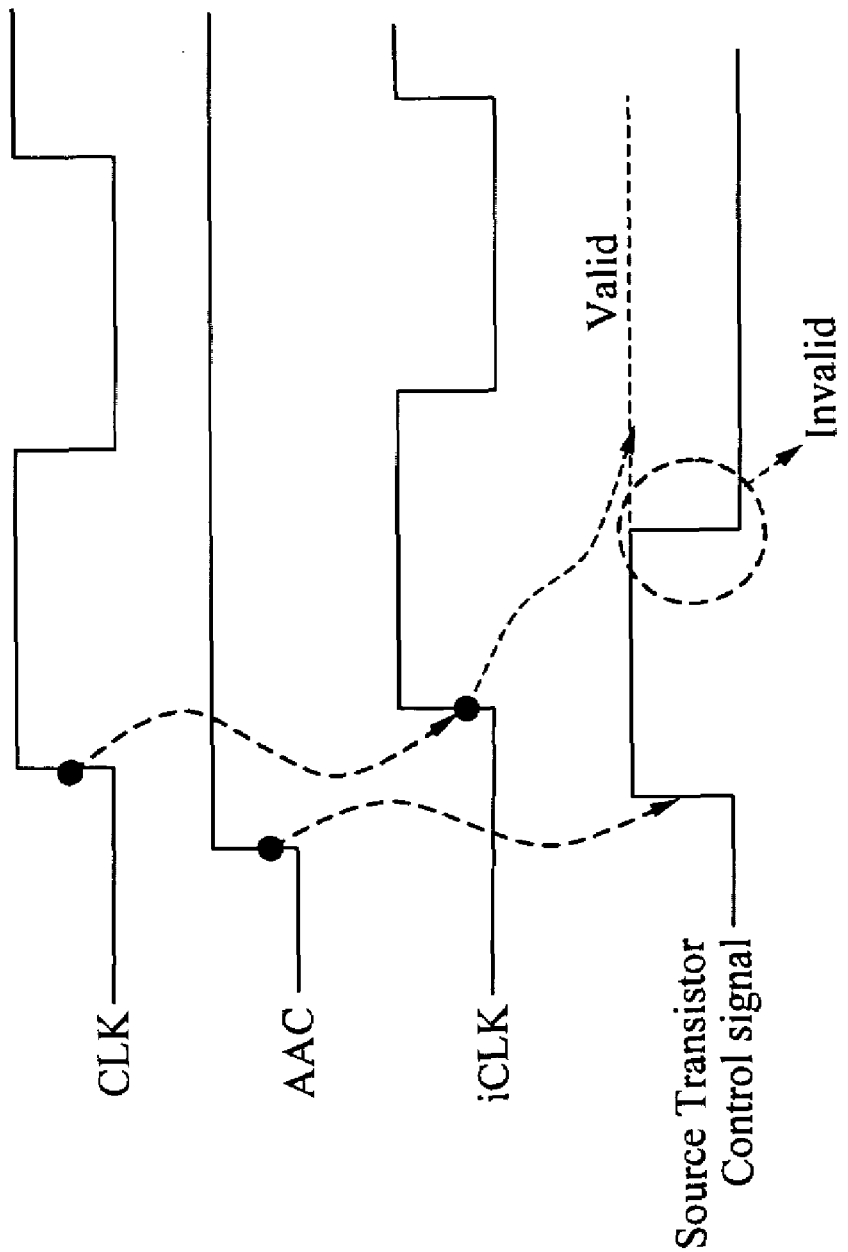
FIG. 15 is a timing diagram of controlling source transistors with chip control signals according to an aspect of the present invention.
Figure 20A:
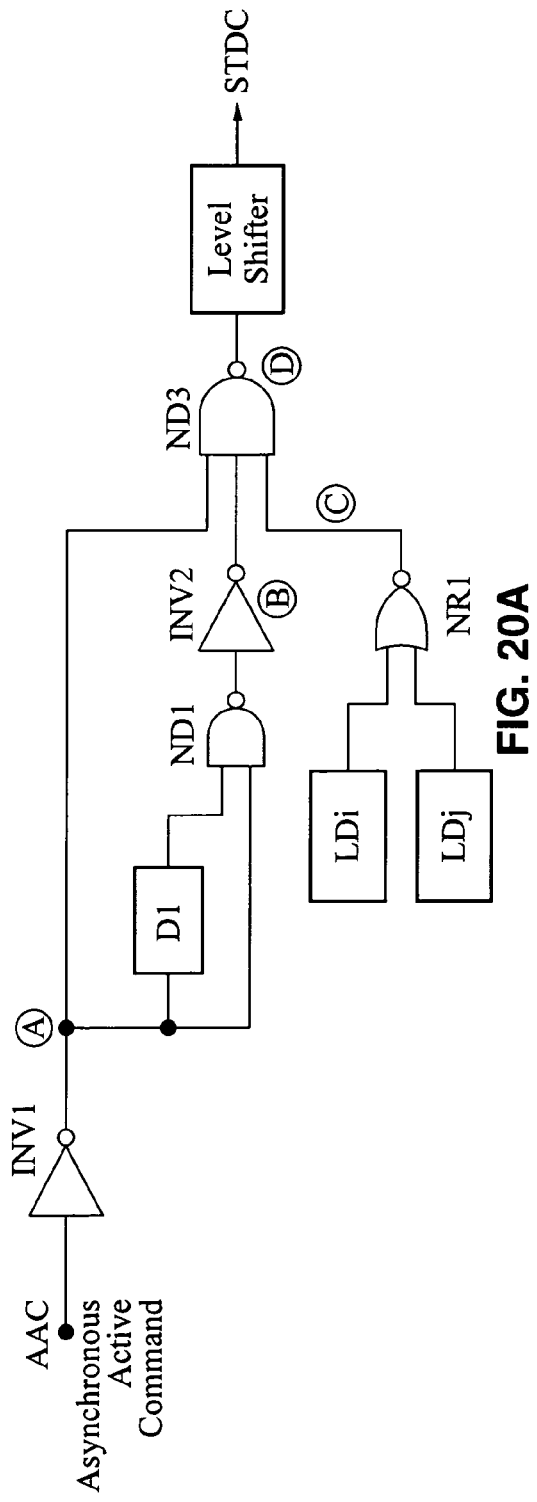
FIG. 20A-20C are schematics of bank interleaving according to an aspect of the present invention.

FIG. 15 and FIG. 20A illustrate a timing diagram and a circuit implementation to control source transistors so as not to reduce chip speed and to avoid unnecessary power consumption due to frequent charging and discharging of source transistor gate capacitance. AAC (Asynchronous Active Command) signal is used to enable source transistors. When AAC is high, node A and D go to low and high, respectively. The voltage of node D is raised by a level shifter when the source transistor control signal STDC needs a boosted voltage to avoid a voltage drop by Vtn for NMOS power source transistors. Therefore, source transistors can be enabled earlier than the system clock CLK as shown in FIG. 15. The enabled source control signal is required to be maintained by utilizing a signal delay D1 after AAC goes to high until another signal synchronized with internal the clock iCLK is received to determine its validity.

In a memory with multiple bank organization, source transistors need to be controlled precisely not to cause any speed delay and to eliminate any unnecessary power consumption due to frequent charging and discharging of source transistor gate capacitance. LDi and LDj (Late Determination) signals to determine whether or not a bank is activated. When at least one bank is activated either one of the signals goes to high and node C becomes low and the source transistor control signal STDC is enabled.

Figure 20B:
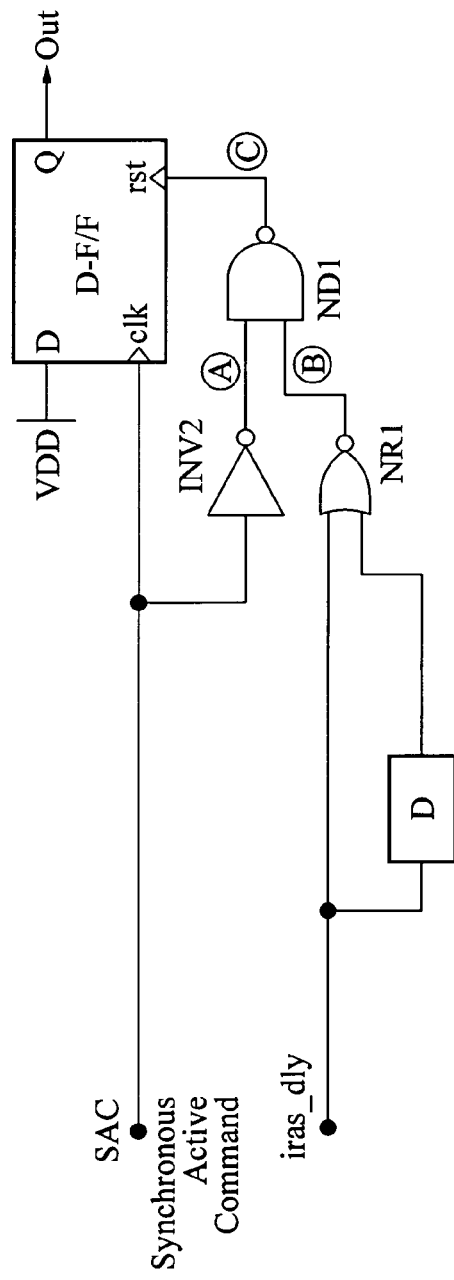

FIG. 20B illustrates an implementation of late determination circuits, LDi and LDj, in FIG. 20A. This output Out is enabled by an active signal synchronized with the clock SAC (Synchronized Active Command). When SAC is high, Out goes to high. Therefore, node C in FIG. 20A goes to low. When SAC goes to low, node A goes to high. When a signal, iras_dly, which is a delayed signal to tell that a RAS chain operation is completed, goes to low, node B goes to high and node C becomes low to reset Out to be low.

Figure 20C:
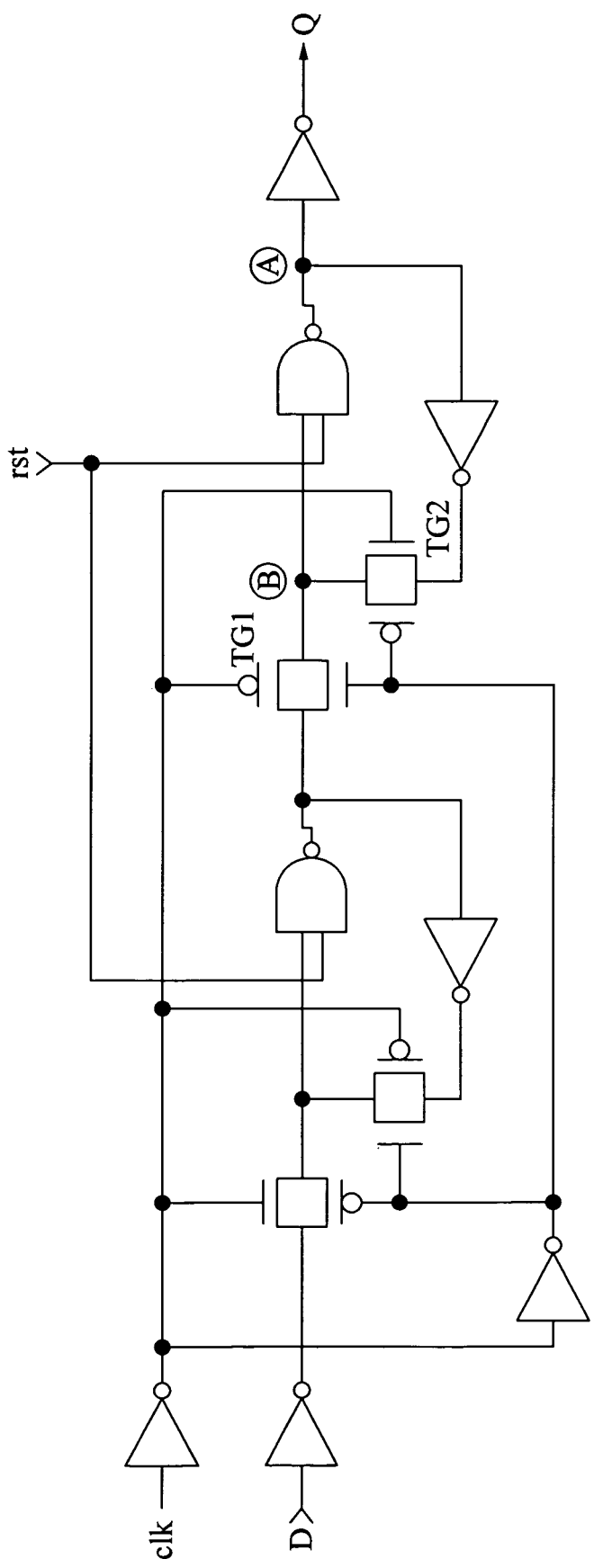

FIG. 20C shows an implementation of a D-F/F in FIG. 20B. When synchronous signal (SAC in FIG. 20B and clk in FIG. 20C) goes to low then signal TG1 is turned off and signal TG2 is turned on. When a signal rst goes to low, node A goes to high and the output Q goes to low and node B goes to low to maintain node A high.

Therefore, source transistors can be enabled earlier before the circuit operation commences to recover a virtual power line level to VDD or VSS wherein unnecessary power consumption due to frequent enabling and disabling of source transistor control signals can be eliminated.

Effective control of special circuits such as DC generator is important for the memory chip design. DC generator for the other part is enabled earlier before the actual operation by the early coming signal. For example, DC generator for CAS chain is activated when row control signal is activated and the DC generator for the RAS chain control which is used in the following cycle is activated by CAS control signal.

Figure 16:
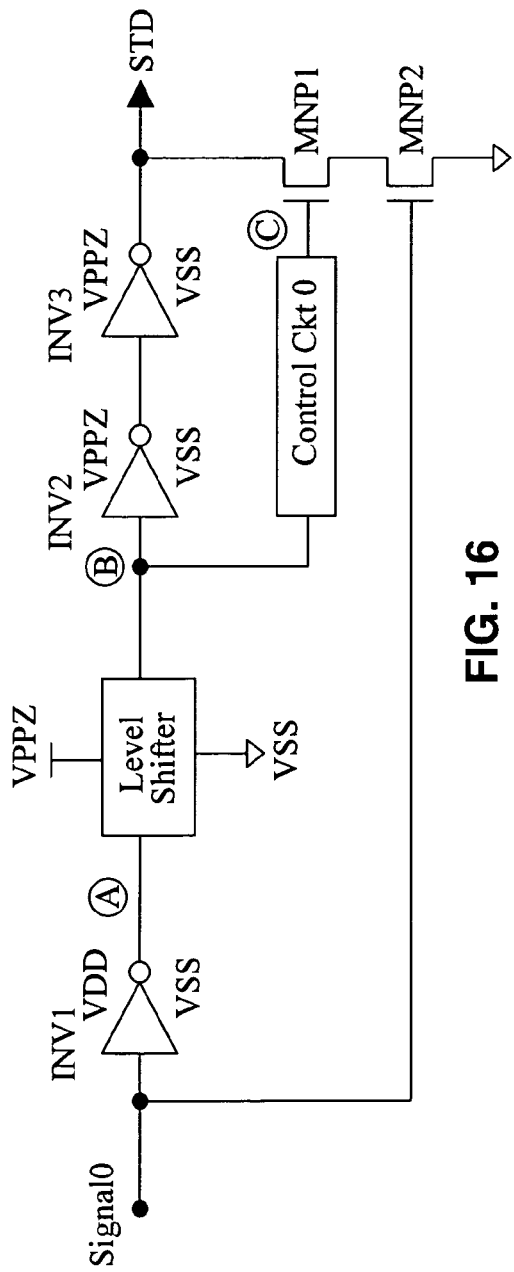
FIG. 16-17 are schematic of early enable and late disable control schemes which avoid signal skew according to an aspect of the present invention.
Figure 17:
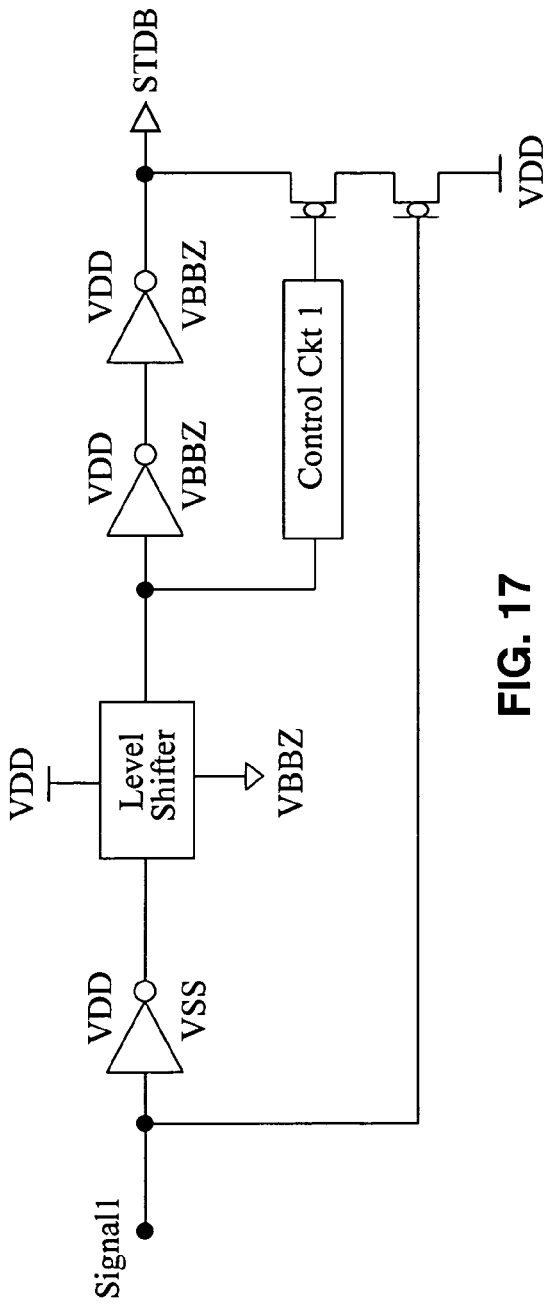

FIG. 16 and FIG. 17 illustrate an early enable and disable control scheme in which a directional transistor configuration is utilized with an additional control path to avoid a signal skew. When Signal0 is low and MNP2 is turned off. Node B is high and MNP1 is turned on, and the output, STD, is high. When Signal0 goes to high, MNP2 is enabled immediately and the output STD is discharged to be low before an NMOS transistor of INV3 is turned on. As a result, by using an NMOS transistor of INV2 and a PMOS transistor of INV3 having larger current driving capability than that of a PMOS transistor of INV2 and an NMOS transistor of INV3, enabling speed can be improved and by using an additional discharge path composed of MNP1 and MNP2, disabling speed can also be improved.

Figure 18A:
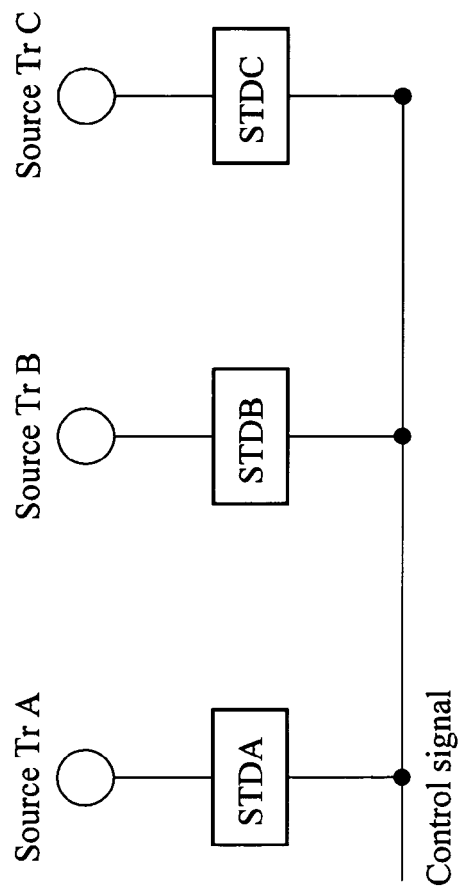
FIG. 18A-18B are schematics of source transistor placements for differing purposes according to an aspect of the present invention.
Figure 18B:
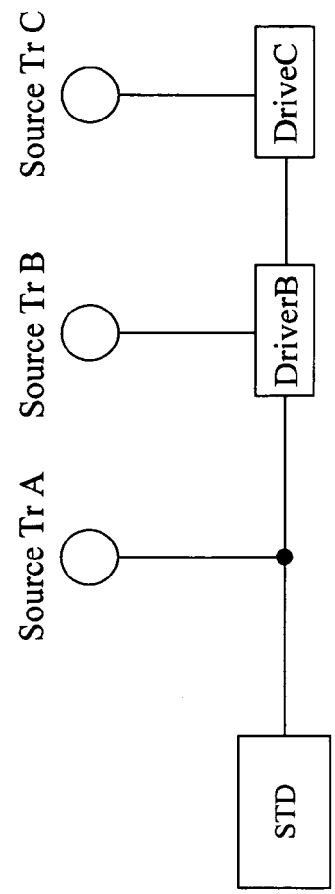

FIG. 18A and FIG. 18B illustrate placement of source transistor control scheme using the same control signal for separate source transistor control signal generators, STDA, STDB and STDC, or using the same source transistor control signal generators and drivers for source transistor control.

Figure 19A:
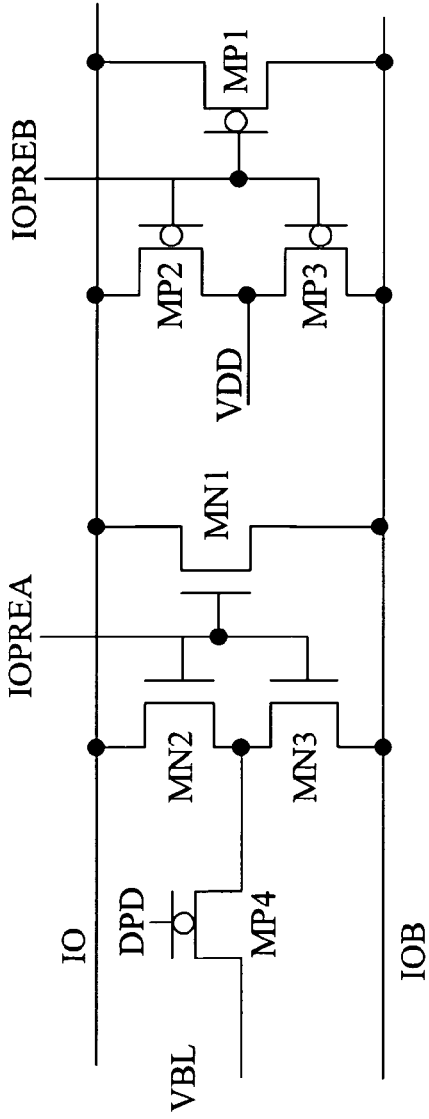
FIG. 19A-19B are schematics of pre-enable signal use according to an aspect of the present invention.
Figure 19B:
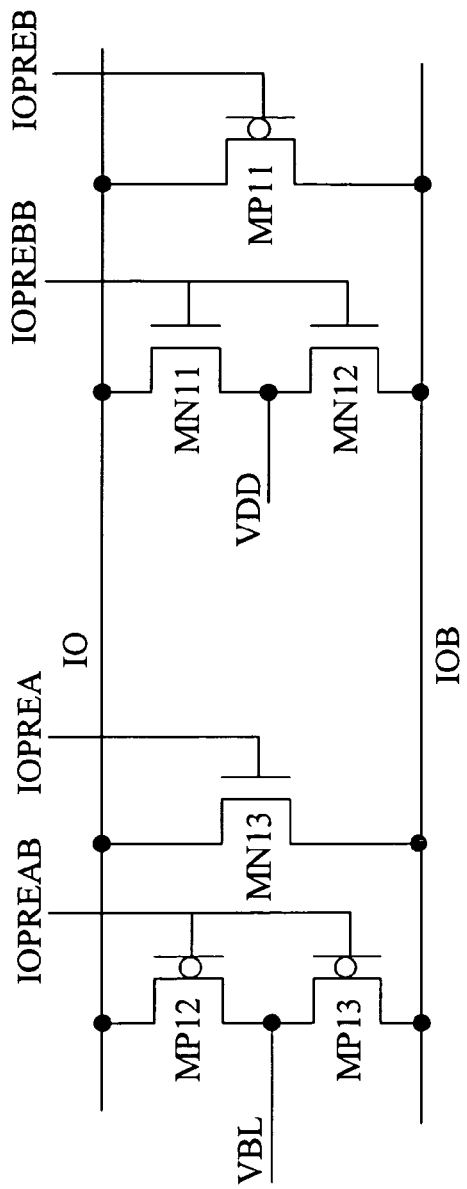

FIG. 19A and FIG. 19B illustrate circuits to suppress leakage current from IO lines in a DRAM chip to half the voltage of generator VBL. Without the device MP4, there is a current path with current leakage flowing through MP2 and MN2, or MP3 and MN3, to a DC generator, VBL. By placing a switch device, MP4, which is turned off during an operating mode such as deep power down mode, a self reverse biased condition between NMOS transistors, MN2 and MN3 and MP4, is formed and leakage current can be suppressed significantly. Since there are a number of these, such as IO precharge circuits in DRAMs, leakage flowing from the path above is very significant. By forming a self-reverse biased condition, leakage current in the entire DRAM chip can be suppressed. The switch device can be placed per bit line or shared by multiple bit lines, or placed per block, and so forth. Another implementation of the circuit to reduce leakage current in a DRAM IO precharge circuit is shown in FIG. 19B.

A number of circuit configurations and methods can be implemented in view of the teachings presented above. The following provides information about the adjustment of array and peripheral power levels, separation of virtual power line, and the source transistor control method in a summary form.

1. Power Adjustment in Response to Mode.

Adjustment of array and peripheral power level for different operating modes. For example, when the chip goes into self-refresh mode, the power for peripheral circuits is lowered and the power for array is raised in relation to normal operating mode. The output voltage level of DC generators can be adjusted for different operating modes.

2. Separation of Virtual Power Line.

The virtual power line can be separated in a number of ways, which can be implemented separately, and/or in some cases combined.

(a) Divide or separate the power lines according to operation path (RAS chain, CAS chain, buffer, clock).

(b) Divide or separate the power lines for memory banks within operation path.

(c) Use of control signal DC generators, separately or in combination, to control the divided or separated virtual power lines.

(d) Existence of DC generators or separation of power line for large driver circuits.

(e) Placement of stacked and/or combinational source transistors separately or in combination on the power line.

(f) Placement of hetero or homo transistors on power line in active mode to increase current driving capability.

(g) Directional placement of transistors. Exemplified by FIG. 11, FIG. 12 and FIG. 13.

(h) Control of column path source transistor using RAS active information.

(i) Separate control of source transistors for each current mode.

3. Source Transistor Control Method.

(a) Control of source transistors per function as defined by CKE in separated or merged power line structure.

(b) Control of source transistors per function as defined by RAS in separated or merged power line structure.

(c) Control of source transistors per function as defined by CAS in separated or merged power line structure.

(d) Power line separation as follows:
   i. command+address buffer,
   ii. CKE buffer,
   iii. RAS chain, and
   iv. CAS chain+din (e) Different source transistor configurations and related control methods according to signal timing margin such as a wake-up time (FIG. 14).

(f) Source transistor control methods with multi-states. Example: Vss →vdd→vppz (a boosted voltage) depending on operating modes and timing margin.

(g) Design methodology—source transistor size is fixed first by operating modes and design logic circuit with transistors of different Vts (source transistor sizing first and logic transistor sizing later).

(h) An example of circuit design style including source transistors and dynamic logic with a keeper and discharge path. Transistor sizes of keeper and discharge path can be different. A power source control method is shown in FIG. 15 and related logic implementation.

(i) In bank interleaving a method is shown to prevent a condition in which a DC generator is not activated while control signals such as STDC need to be toggled, as represented by FIG. 20A-20C.

(j) Late Determination, as follows:
  i. source transistor is turned off with a delay after the RAS command is off,
  ii. a method to avoid unnecessary and excessive power consumption due to frequently repeated source transistor control during frequent operation, and
  iii. a method to avoid a unnecessarily frequent source transistor control for consecutive row commands.

(k) Early enable and late disable control scheme: directional transistor configuration with an additional control path to avoid a signal skew, which is exemplified by FIG. 16 and FIG. 17.

(l) DC generator for the other part is enabled earlier before the actual operation by the earlier coming signal. An example is DC generator for a CAS chain which is activated when row control signal is activated, and the DC generator for the RAS chain control which is used in the following cycle which is activated by CAS control signal.

(m) Placement of dummy capacitance at the virtual power line for operating modes and control paths defined by different combination of signals.

(n) Placement of source transistors for current specification.

(o) Bit-line sense amplifier structure and control methods, as follows:
  i. hetero source transistors connected with bit line sense amplifiers are intelligently used in standby and self-refresh modes according to current specification,
  ii. LAPG generator supplies boosted voltage, i.e., VPPZN-BBZ, and
  iii. deep powerdown.

(p) NMOS sub-word line driver scheme.

(q) The use of a homo-source transistor in a row decoder.

(r) Separate control of DC generators to generate boosted voltages for bit-line sense amplifiers.

(s) The use of initial signal in the circuit structure with alternatively connected homo- and/or hetero source transistors.

(t) Design flow and methodology and DA tool to prevent abnormal current path due to separated power lines.

(u) Placement of source transistor control signal driver for different purposes, such as to support operating modes and current specifications, exemplified by FIG. 18.

(v) Level shifter.

(w) pxid leakage current management.

(x) Scheme to prevent leakage current by forming zlogic condition (self-reverse biasing condition) in input/output (IO) precharge, as exemplified by FIG. 19.

(y) The location of vppz/vbbz pump, such as:
  i. close to power line to supply the precharge level,
  ii. the distributed placement of small pump.

4. Layout.

(a) Placement of source transistors under power and routing signal busses.

(b) Routing of source transistor control signal using active area and placement of source transistors in remaining area.

(c) The placement of source transistors in power mesh area.

(d) Combination of elements a, b and c above.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Source Transistor Configurations and Control Signals

| | | S | SB | PA | NA | PB | NB |
|---|---|---|---|---|---|---|---|
| Active Mode (IDD0) | all | VPPZ | VBBZ | VBBZ or VSS | VPPZ or VDD | VBBZ or VSS | VPPZ or VDD |
| Active-standby Mode (IDD3N) | all | VPPZ | VBBZ | VBBZ or VSS | VPPZ or VDD | VBBZ or VSS | VPPZ or VDD |
| Active Power Down Mode (IDD3P) | BUF | VSS | VDD | VDD | VSS | VDD | VSS |
| | RAS | VPPZ | VBBZ | VBBZ or VSS | VPPZ or VDD | VBBZ or VSS | VPPZ or VDD |
| | CAS | VSS | VDD | VDD | VSS | VDD | VSS |
| Precharge Standby Mode (IDD2N) | BUF | VPPZ | VBBZ | VBBZ or VSS | VPPZ or VDD | VBBZ or VSS | VPPZ or VDD |

TABLE 1-continued

Source Transistor Configurations and Control Signals

|  | | S | SB | PA | NA | PB | NB |
|---|---|---|---|---|---|---|---|
|  | RAS | VSS | VDD | VDD | VSS | VDD | VSS |
|  | CAS | VSS | VDD | VDD | VSS | VDD | VSS |
| Precharge Power Down Mode (IDD2P) | BUF | VSS | VDD | VDD | VSS | VDD | VSS |
| Self Refresh Mode (IDD6) | BUF | VSS | VDD | VDD | VSS | VDD | VSS |
| Deep Power Down Mode(IDD8) | BUF | VSS | VDD | VDD | VSS | VDD | VSS |

What is claimed is:

1. An apparatus for controlling power within an integrated circuit subject to operation across multiple power modes, comprising:
   at least one transistor of a digital logic circuit;
   at least one virtual supply connection for supplying VSS or VDD to said transistor of said digital logic circuit;
   at least two source transistors coupled in a stack between VSS or VDD and said virtual supply connection, with gates configured for being separately driven;
   wherein said stack comprises both NMOS and PMOS transistors; and
   means for driving the separate gates of said source transistors, to change the voltage level of said VSS or VDD supplied through said stack, in response to multiple power modes of said integrated circuit.

2. An apparatus as recited in claim 1, wherein said virtual supply connection is set to a selected voltage level in response to different operating modes of said integrated circuit.

3. An apparatus as recited in claim 1, wherein voltage difference between VSS or VDD and said virtual supply connection for VSS or VDD, is less in response to active-standby mode than in response to deep power down mode.

4. An apparatus as recited in claim 1, wherein voltage level of said virtual supply connection is established by a configuration of said source transistors.

5. An apparatus as recited in claim 1, wherein voltage level of said virtual supply connection is established by independently driving the gate voltages of said at least two source transistors.

6. An apparatus as recited in claim 1, wherein voltage level of said virtual supply connection during self-refresh mode is different from the voltage level of said virtual supply connection during other modes.

7. An apparatus as recited in claim 6, wherein said voltage level is lower than VDD if said virtual supply connection supplies power from VDD, and higher than VSS if said virtual supply connection supplies power from VSS.

8. An apparatus as recited in claim 7, wherein said VSS comprises a VSS signal used for the bit line sense amplifier.

9. An apparatus as recited in claim 1, wherein said virtual supply connection is separated into at least two virtual supply connections and said virtual supply connections each comprise at least two source transistors that are coupled between VSS or VDD and said virtual supply connection.

10. An apparatus as recited in claim 9, wherein the voltage level of at least one of said virtual supply connections is controlled independently.

11. An apparatus as recited in claim 9, wherein said virtual supply connection is separated by function, bank, operation mode, transistor size, DC generator configuration, or DC generator operation.

12. An apparatus as recited in claim 9, wherein said source transistors are controlled by function, bank, operation mode, transistor size, DC generator configuration, or DC generator operation.

13. An apparatus as recited in claim 9, wherein said virtual supply connection is separated into virtual supply connections comprising those for address buffer, CAS, RAS, or CKE function blocks.

14. An apparatus as recited in claim 13, wherein the virtual supply connection for at least one said function block is further separated based on timing.

15. An apparatus as recited in claim 1, wherein at least one source transistor is coupled between said VSS or VDD and said virtual supply connection, in parallel to said at least two source transistors.

16. An apparatus as recited in claim 15, wherein the control voltage swing for said at least one source transistor is larger for a heterogeneous source transistor than for a homogeneous source transistor.

17. An apparatus as recited in claim 15, wherein one or more transistors, within said at least one source transistor, is configured with a control voltage swing exceeding VSS or VDD supply voltage.

18. An apparatus as recited in claim 1:
   wherein one or more transistors is homogeneous, within said at least two source transistors, said homogeneous transistor being of the same type as said at least one transistor of said logic circuit; and
   wherein one or more transistors is heterogeneous, within said at least two source transistors, said heterogeneous transistor being of a different type than said at least one transistor of said logic circuit.

19. An apparatus as recited in claim 1, wherein one of said at least two source transistors is a heterogeneous source transistor coupled to VSS or VDD.

20. An apparatus as recited in claim 19, wherein the voltage swing of the control signal for said heterogeneous source transistor is larger than the voltage swing of the control signal for said homogeneous source transistor.

21. An apparatus as recited in claim 1, wherein one or more transistors of said at least two source transistors is configured with a control voltage swing larger than supply power voltage.

22. An apparatus as recited in claim 1, wherein as said logic circuit is ready to execute a command, an enabling signal for said source transistor is received earlier than a system clock signal corresponding to said command, whereafter a disabling signal for said source transistor is received later than said system clock signal.

23. An apparatus as recited in claim 22, wherein said enabling signal is generated from an asynchronous signal associated to said command.

24. An apparatus as recited in claim 22, wherein said disabling signal is generated from an internally delayed signal within the circuitry configured for executing said command.

25. An apparatus for controlling source transistors within an integrated circuit subject to operation across multiple power modes, comprising:
- at least one transistor of a digital logic circuit;
- a first virtual supply connection for supplying VSS to said transistor of said logic circuit;
- a second virtual supply connection for supplying VDD to said transistor of said logic circuit;
- at least a first and second transistor, arranged in a stack, and coupled between VSS and said first virtual supply connection;
- said first and second transistor comprising both NMOS and PMOS transistors;
- at least a third and fourth transistor, arranged in a stack, and coupled between VDD and said second virtual supply connection;
- said third and fourth transistor comprising both NMOS and PMOS transistors; and
- means for separately driving the gates of said first, second, third and fourth transistors in response to said circuit changing between active mode and at least one power down mode to change the voltage level of said VSS and VDD supplied through each respective said stack;
- wherein said first and second virtual supply connections are separated according to different operating paths; and
- wherein said at least one power down mode comprises an active-standby mode, or a deep power down mode, or both an active-standby mode and a deep power down mode.

26. A method of controlling source transistors within an integrated circuit subject to multiple power modes, comprising:
- forming a first and second virtual supply connection to the circuitry;
- stacking a first plurality of transistors between VSS and said first virtual supply connection;
- said stacked first plurality of transistors comprising both NMOS and PMOS transistors;
- stacking a second plurality of transistors between VDD and said second virtual supply connection; and
- said stacked second plurality of transistors comprising both NMOS and PMOS transistors;
- separately driving the gating of said first and second plurality of transistors in response to the power mode of said circuit to change the voltage level of said VSS and VDD supplied through each respective said stack.

* * * * *